United States Patent
Bose et al.

(10) Patent No.: US 8,949,101 B2
(45) Date of Patent: Feb. 3, 2015

(54) HARDWARE EXECUTION DRIVEN APPLICATION LEVEL DERATING CALCULATION FOR SOFT ERROR RATE ANALYSIS

(75) Inventors: Pradip Bose, Yorktown Heights, NY (US); Meeta S. Gupta, White Plains, NY (US); Prabhakar N. Kudva, New York, NY (US); Daniel A. Prener, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 13/271,827

(22) Filed: Oct. 12, 2011

(65) Prior Publication Data
US 2013/0096902 A1    Apr. 18, 2013

(51) Int. Cl.
G01R 31/3181    (2006.01)
G06F 17/50    (2006.01)
G01R 31/3183    (2006.01)

(52) U.S. Cl.
CPC .. G01R 31/31816 (2013.01); G01R 31/318357 (2013.01); *G06F 17/5022* (2013.01)
USPC .............................. 703/14; 716/106; 716/136

(58) Field of Classification Search
CPC ................... G06F 11/261263; G06F 11/3414; G06F 11/3447; G06F 11/3457; G06F 17/5009; G06F 17/5022; G06F 17/5027; G06F 17/5036; G06F 17/5045; G01R 31/31816; G01R 31/318357
See application file for complete search history.

(56) References Cited

U.S. PATENT DOCUMENTS

| | | |
|---|---|---|
| 6,986,078 B2 | 1/2006 | Rodbell et al. |
| 7,203,881 B1 | 4/2007 | Williams et al. |
| 7,328,376 B2 | 2/2008 | McGuire et al. |
| 7,472,051 B2 | 12/2008 | Mariani et al. |
| 2001/0039642 A1 | 11/2001 | Anzai |
| 2008/0016477 A1 | 1/2008 | Kleinosowski et al. |
| 2008/0191769 A1 | 8/2008 | Uemura et al. |
| 2009/0193296 A1* | 7/2009 | Kellington et al. ............. 714/33 |

(Continued)

OTHER PUBLICATIONS

Cook et al., A Characterization of Instruction-level Error Derating and its Implications for Error Detection, 2008.*

(Continued)

*Primary Examiner* — Kamini S Shah
*Assistant Examiner* — Michael P Healey
(74) *Attorney, Agent, or Firm* — Stephen R. Tkacs; Stephen J. Walder, Jr.; Jennifer R. Davis

(57) ABSTRACT

Mechanisms are provided for predicting effects of soft errors on an integrated circuit device design. A data processing system is configured to implement a unified derating tool that includes a machine derating front-end engine used to generate machine derating information, and an application derating front-end engine used to generate application derating information, for the integrated circuit device design. The machine derating front-end engine executes a simulation of the integrated circuit device design to generate the machine derating information. The application derating front-end engine executes an application workload on existing hardware similar in architecture to the integrated circuit device design and injects a fault into the existing hardware during execution of the application workload to generate application derating information. The machine derating information is combined with the application derating information to generate at least one soft error rate value for the integrated circuit device design.

25 Claims, 10 Drawing Sheets

(56) References Cited

U.S. PATENT DOCUMENTS

2009/0249301 A1* 10/2009 Kalla et al. ............... 717/127
2010/0083203 A1* 4/2010 Bose et al. ............... 716/6

OTHER PUBLICATIONS

Gschwind et al., SoftBeam: Precise Tracking of Transient Faults and Vulnerability Analysis at Processor Design Time, May 18, 2009.*
Rivers et al., Phaser: Phased methodology for modeling the system-level effects of soft errors, IBM J. Res. & Dev. vol. 52 No. 3 May 2008.*
Sanda et al., Soft-error resilience of the IBM POWER6 processor, IBM J. Res. & Dev. vol. 52 No. 3 May 2008.*
Sanda et al., Sustaining Error Resiliency: The IBM POWER6 Microprocessor, online: http://webhost.laas.fr/TSF/WDSN08/2ndWDSN08(LAAS)_files/Slides/WDSN08S-01-Sanda.pdf, retrieved: Apr. 17, 2014.*
U.S. Appl. No. 12/243,427.
Bender, C, et al., "Soft-error resilience of the IBM POWER6 processor input/output subsystem", IBM J. Res. & Dev., vol. 52, No. 3, May 2008, pp. 285-292.
Kanawati, Nasser A. et al., "Dependability Evaluation using Hybrid Fault/Error Injection", IEEE, 1995, pp. 224-233.
Kellington, Jeffrey W. et al., "IBM POWER6 Processor Soft Error Tolerance Analysis Using Proton Irradiation", domino.research/ibm.com/comm/research, IBM Sys & Techgy Gp, Austin,TX, 2007, 6 pages.
Kudva, Prabhakar et al., "Early Performance Prediction", Proceedings of the Workshop on Complexity-Effective Design: Held in Conjunction with the 32nd International Symposium on Computer Architecture, 2005, www.csi.cornell.edu/albonesi/wced05/wced05.pdf, pp. 1-18.
Kudva, P. et al., "Fault Injection Verification of IBM POWER6 Soft Error Resilience", citeseerx.ist.psu.edu/viewdoc/download, 2006, 4 pages.
Li, Xiaodong et al., "Architecture-Level Soft Error Analysis: Examining the Limits of Common Assumptions", Proceedings of the 37th Annual EEE/IFIP International Conference on Dependable Systems and Networks (DSN'07), Jun. 2007, 10 pages.
Li, Xiaodong et al., "Scaling of Architecture Level Soft Error Rate for Superscalar Processors", rsim.cs.illinois.edu/pubs/05selse.pdf. 2005, pp. 1-7.
Li, Xiaodong et al., "SoftArch: An Architecture-Level Tool for Modeling and Analyzing Soft Errors", IEEE, DSN'05 Proceedings of 2005 Intern't Conf on Dependable Sys & Networks, 2005, 10 pages.
Ludden, J.M. et al., "Functional verification of the POWER4 microprocessor and POWER4 multiprocessor systems", IBM Corporation, IBM J. Res. & Dev., vol. 46, No. 1, Jan. 2002, pp. 53-76.
Ma, Zhe et al., "System-level analysis of soft error rates and mitigation trade-off explorations", Reliability Physics Symposium (IRPS), 2010 IEEE Interna'l. Jun. 17, 2010, pp. 1-5.
Mukherjee, Shubhendu et al., "A Systematic Methodology to Compute the Architectural Vulnerability Factors for a High-Performance Microprocessor". Proceedings of the 36th Annual IEEE/ACM International Symposium on Microarchitecture (MICRO), Dec. 2003, pp. 12 pages.
Ramachandran, Pradeep et al., "Statistical Fault Inje3ction", In Proc. Int'l Conf. on Dependable Systems mand Networks (DSN), Jun. 2008, 6 pages.

* cited by examiner

US 8,949,101 B2

HARDWARE EXECUTION DRIVEN APPLICATION LEVEL DERATING CALCULATION FOR SOFT ERROR RATE ANALYSIS

GOVERNMENT RIGHTS

This invention was made with United States Government support under Contract No.: HR001107-9-0002 awarded by Defense Advanced Research Projects Agency (DARPA). The Government has certain rights in this invention.

BACKGROUND

The present application relates generally to an improved data processing apparatus and method and more specifically to mechanisms for collecting data related to the masking (or derating) characteristics of a given workload when executed on a microprocessor based computing system, under an environment where transient errors may affect the correctness of individual data storage bits during the computation process.

As technological trends head toward smaller devices and wire dimensions, system design is entering an era of increased chip integration, reduced supply voltages, and higher frequencies. An inescapable consequence of this development is the fact that transient/soft errors will continue to be a serious threat to the general technology of robust computing. Transient errors may occur due to a variety of events, most notable among them being the impact of high energy cosmic particles, alpha particle effects due to the presence of lead in packaging materials, and inductive noise effects (Ldi/dt) on the chip supply voltage resulting from aggressive forms of dynamic power management.

Current soft error rate (SER) projections for Static Random Access Memory (SRAM) cells, latch elements, and logic elements, as technology scales from 65 nm towards 45 nm and beyond, indicate that the SER per bit for SRAM cells appears to be leveling off. However, it must be noted that the bit count per chip is increasing exponentially, per Moore's Law. Latch SER is catching up with SRAM per-bit rates with a steeper slope of increase. Logic SER is projected to increase at a much faster pace, although the absolute numbers are significantly smaller than SRAM or latch numbers at the present time. For Silicon On Insulator (SOI) technology, going forward from 65 nm to 45 nm technology, the latch SER per bit is predicted to increase 2× to 5× fold, and latches per chip are of course expected to increase with integration density. Again, storage cell SER will still dominate and latch errors will also be of increasing relevance at 45 nm technologies and beyond.

SUMMARY

In one illustrative embodiment, a method, in a data processing system, is provided for predicting effects of soft errors on an integrated circuit device design. The method comprises configuring the data processing system to implement a unified derating tool. The unified derating tool comprises a machine derating front-end engine used to generate machine derating information for the integrated circuit device design, and an application derating front-end engine used to generate application derating information for the integrated circuit device design. The method further comprises executing in the data processing system, by the unified derating tool, the machine derating front-end engine on a simulation of the integrated circuit device design to generate the machine derating information. Moreover, the method comprises executing in the data processing system, by the unified derating tool, the application derating front-end engine to execute an application workload on existing hardware similar in architecture to the integrated circuit device design and inject a fault into the existing hardware during execution of the application workload on the existing hardware to generate application derating information. In addition, the method comprises combining, by the data processing system, the machine derating information with the application derating information to generate at least one soft error rate (SER) value for the integrated circuit device design. The SER value may be measured in a standard unit of failures in time (FIT).

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
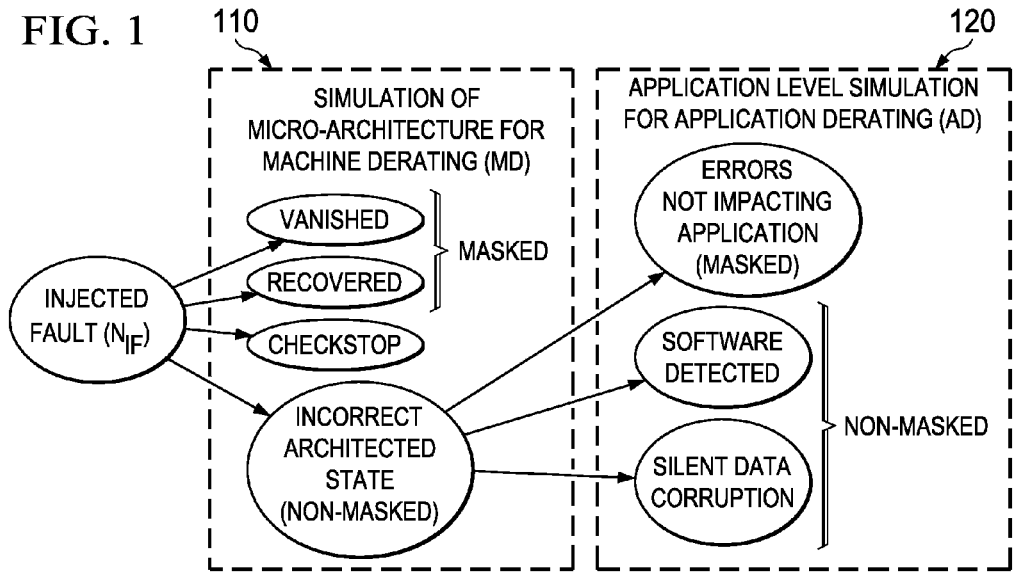
FIG. 1 is an example diagram that illustrates the relationship between machine derating and application derating.

Because of the predicted increase in Soft Error Rates (SERs), it is important to have accurate estimates of failure rates during the design phase of integrated circuit devices. One way to estimate failure rates during the design phase of an integrated circuit device is to perform statistical fault injection (SFI) into a register transfer level (RTL) simulator. SFI involves injecting faults into a simulation by causing one or more registers in the integrated circuit design to flip its state, i.e. flip a bit. The particular register(s) selected may be randomly selected, preselected, i.e. directed faults, or a combination of random and preselected fault injections. One example for performing SFI operations with an RTL simulator is described in Ramachandran et al., "Statistical Fault Injection," Proceedings of the International Conference on Dependable Systems and Networks (DSN), June 2008.

Using SFI allows the simulation to determine machine derating values for a given application run. The term "derating" or "de-rate" refers to the portion of time an integrated circuit design or structure is not in use, or during which it is operating but in a manner that cannot affect an executing workload's correctness. Therefore, it can be said that the structure or design is not susceptible to soft errors during that time period. This is termed de-rating because it reduces the overall opportunity for soft error vulnerability in a design or structure from a baseline or raw SER value (derived from the underlying unit/structure hardware primitives, which does not take the specific implementation usage into account).

Machine derating values are values indicative of a relative amount of errors that are masked, recovered, or otherwise not detectable in the output of the integrated circuit due to the underlying micro-architecture operation. The SFI mechanism simulates the micro-architecture with an injected fault and the resulting output of the simulation indicates the states of the various circuit elements as a result of operating on workloads provided to the simulation in the presence of the injected fault. For example, one can determine that an injected fault is propagated from one circuit element to another and causes certain circuit elements to have an incorrect state, whereas other circuit elements are not affected by the injected fault. In other cases, an injected fault may vanish, be recovered, or otherwise be masked through operation of the micro-architecture and will not negatively affect the operation of the micro-architecture. The relative measure of these different possibilities is referred to herein as the machine derating value or factor. For example, a machine derating value may be a percentage of the number of faults that are masked by the micro-architecture, e.g., 90% masking machine derating factor.

While these SFI mechanisms allow one to obtain machine derating values, SFI mechanisms do not provide information regarding the application level derating component. The application level derating (AD) values are values indicative of a relative amount of faults or errors at the level of the application-visible state that are masked, recovered, or otherwise not detectable in the output of an application, i.e. application level derating deals with state corruption visible at the application level while machine derating deals with state corruption visible at the hardware, or micro-architecture, level. That is, faults injected into the underlying micro-architectural state (e.g., pipeline or staging latches, intermediate tables, buffers and queues, etc.), in particular, soft errors or transient errors induced by cosmic radiation and the like, may not be masked at the micro-architectural state level, but may be masked at the application level. For example, a register (i.e. a latch bank) having an injected fault present in the micro-architecture may not actually be used by the application and thus, would be masked at the application level. As another example, software running on the hardware may actually read or make use of an erroneous (or corrupted) data value but the error may still not affect the integrity of the final calculated values that are generated during the execution of the application. As a result, the injected fault, soft error, transient error, or the like, is masked by the software executing on the hardware.

The total derating value for the system is a combination of both the machine derating and application derating values. The total derating value is a measure of how susceptible the system is to soft errors or transient errors. FIG. 1 is an example diagram that illustrates the relationship between machine derating and application derating. As shown in FIG. 1, an injected fault $N_{IF}$ represents a soft error or transient error that is introduced into a system, such as due to radiation or the impact of alpha particles on the circuitry of the system. This injected fault essentially causes one or more bits in one or more registers of the system to be flipped so that the bit value is the opposite of the intended bit value. Such soft errors or transient errors are simulated by way of the fault injection process. $N_{IF}$ refers to the number of randomly generated fault injection experiments that may be carried out, in order to collect statistics that would yield the probability of causing a "non-masked" incorrect architected state that is visible by the application.

As shown in FIG. 1, the injected faults $N_{IF}$ are processed by the simulation 110 of the micro-architecture. This simulation of the micro-architecture 110 may result in the injected faults $N_{IF}$ vanishing, being recovered or fixed, or a checkstop. The checkstop results in a machine "crash", where the processor loses all state and it may have to be rebooted before the application execution can be restarted. In the first two cases ("vanished" and "recovered"), the injected error is fully masked by the micro-architecture, in that the application-visible state is not corrupted. For the "checkstop" case, there is a system failure or "crash" but the application state never exhibits an incorrect state. That is, the "checkstop" is a situation where the error was detected by the hardware before any corruption of the architected state, but there was no recovery possible, so the checkstop results in an exception that results in the application or even the processor itself to "crash" prematurely.

The first two outcomes, i.e. vanished and recovered, in the processing of the injected fault during the simulation of the micro-architecture result in the injected fault being truly masked at the micro-architecture level. In other words, even though the fault occurred, it did not negatively affect the integrity of the machine operation in any way. For example, a data bit that is flipped in a region of the chip that is never used in the actual computation, will effectively "vanish." Similarly, certain errors (e.g., those in the bits held within the branch history table) might cause a spurious (unintended) branch mis-prediction, but the processor would eventually recover once the branch recovered and hence, there would be no corruption of the architected program state. Some relevant errors are recoverable, in that they are detected by built-in error detectors in the design and either corrected in-place (via the use of error-correction codes) or through specially designed instruction retry mechanisms. Such errors do not affect architected state correctness either, and are categorized as "Recovered." There is a class of errors that is categorized as "detected but are not recoverable." These are the types of errors that get escalated into a machine "check" or "checkstop" which results in the "crashing" of the system, requiring a reboot or a restart of the application. In this third case ("checkstop") there is a visible failure, but no incorrect architected state is generated or propagated.

In some instances, the injected faults $N_{IF}$ may not be masked at the micro-architecture level and thus, may affect the way in which application workloads are executed on the micro-architecture. Thus, as shown in FIG. 1, the unmasked faults, i.e. the incorrect architected state of the hardware, may cause errors to manifest in the operation of the application, e.g., register values being incorrect or the like. In some cases, the errors that were not masked at the micro-architecture level will not affect the application execution, e.g., in cases where an application does not utilize the registers in which the error is manifest in the micro-architecture, and thus, the faults or errors are masked at the application level simulation 120. In other cases, the errors at the micro-architecture level simulation 110 cause errors to be introduced into the application level simulation 120. Such application level errors may be software detected errors, silent data corruption, or the like.

It can be seen from FIG. 1 that if one were not to consider the effects of application level error masking/non-masking, a full picture of the susceptibility of the system to soft errors and transient errors is not achieved. In some instances, application level error masking/non-masking, i.e. application derating, may account for a significant reduction in the amount of a failures in time (FITs) estimate. Not taking into account the application derating leads to a FITs estimate that is too conservative leading to over-design and higher power consumption designs. Thus, it is important to gain an understanding of the effects of soft errors or transient errors, as modeled by fault injection, at both micro-architecture level (machine derating) and the application level (application derating) to obtain an understanding of the susceptibility of a system to such soft errors or transient errors.

Since both machine derating and application derating values are important to the evaluation of the system as a whole, it is important to have tools available to evaluate both at a pre-silicon stage, i.e. prior to fabrication of the integrated circuit device, so that a reliability of the integrated circuit device design can be determined prior to fabrication. However, there are few solutions for determining application level derating (AD) values, let alone doing so in combination with determining machine derating (MD) values.

One solution for deriving AD values is to use a functional (full-system) simulator to analyze application sensitivity to transient errors. That is, a fault may be injected into a micro-architecture design simulator to thereby simulate a soft error or transient error in the micro-architecture. The running of an application on the micro-architecture design may then be simulated by simulating the entire system. The effects of the injected fault may then be observed in the output of the simulation to derive an application derating value. This solution is very slow and does not allow a broad set of workloads to be characterized because of the practical issue of simulation time involved.

As such, a new solution that is able to derive MD and AD values at, or close to, hardware execution speed would be a valuable addition to current pre-silicon reliability projection methodologies. The illustrative embodiments provide an integrated framework to yield machine derating and application derating values for a target application on a target integrated circuit device at an early-stage chip and system design phase, i.e. pre-silicon stage using existing hardware to approximate a new system design. The illustrative embodiments leverage hardware profiling tools to perform fault injection and control processes within a hardware device to facilitate calculation of machine and application derating factors. In this way, the illustrative embodiments provide a single unified tool to deduce individual contributions, e.g., MD and AD and attendant sub-components, separately.

The mechanisms of the illustrative embodiments, in one phase of operation, utilizes a profiler and residency analyzer to obtain machine derating information for an integrated circuit device design. The illustrative embodiments further provide, in a second phase of operation, an application fault injector that is used to inject faults into an existing hardware device. The existing hardware device executes an application workload and results of the execution are provided to backend mechanisms. The backend mechanisms are utilized to collect application profile information and residency information from the hardware device to thereby approximate the machine derating for the integrated circuit device design being evaluated. The backend mechanisms further collect state information from the existing hardware to approximate the application derating information for the integrated circuit device design being evaluated. The machine derating information and the application derating information are then combined by the backend mechanism to generate one or more soft error rate (SER) failures/faults in time (FIT) projections for the integrated circuit device design. These SER FIT values may be logged or otherwise stored in a data file for later use, output to human user for review, or otherwise output to a system for use in identifying areas of the integrated circuit device design that are susceptible to soft error faults and possibly in need of a redesign to reduce their susceptibility to soft errors.

The net system-level SER FITs value(s) that is/are determined in this manner may be inverted to project the integrate circuit device design's mean time to failure (MTTF). If the projected MTTF value is too small (i.e. below the target quality level or a pre-determined target MTTF value of the intended product) then the integrated circuit device design may be modified or reworked to make sure that the SER FITs value is reduced. This may be accomplished, for example, by selective "hardening" of latches within a unit that has a particularly high SER FITs value, or by adding additional error detection and recovery features into the design. The modified design is then re-evaluated by the pre-silicon SER analysis mechanisms of the illustrative embodiments. This iterative process is repeated until the projected MTTF meets the targeted product quality, while satisfying other metrics like power consumption limits, performance, cost, and the like.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
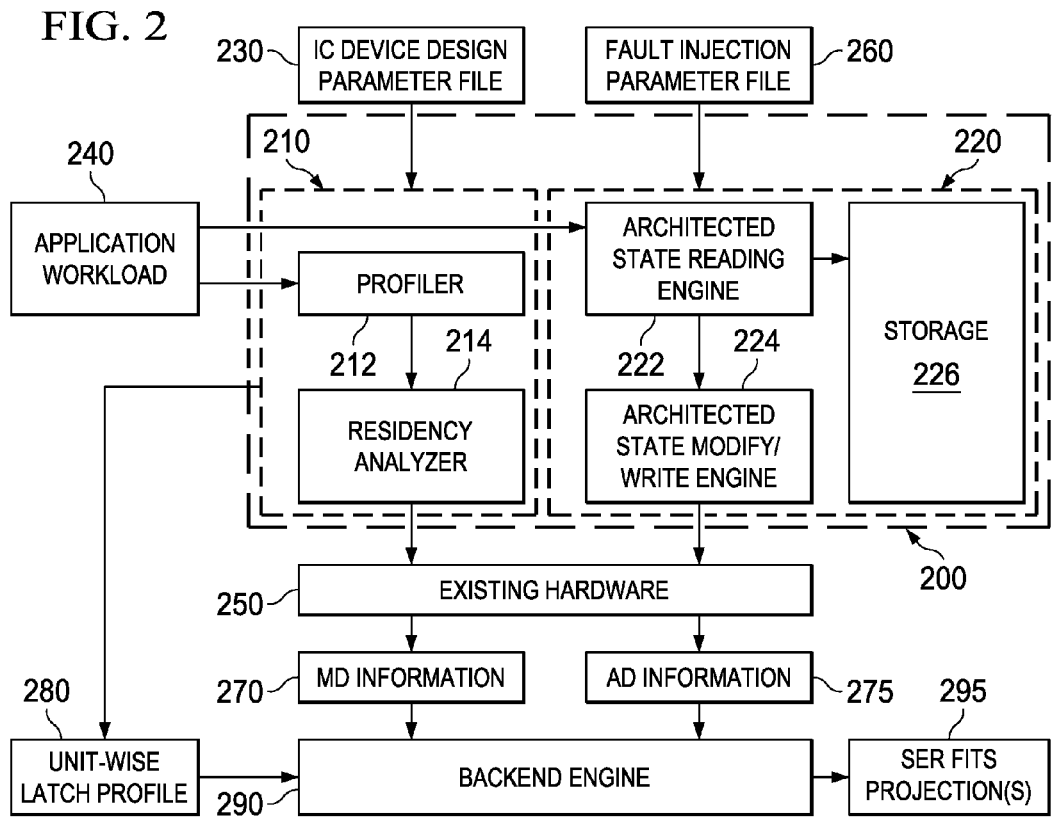
FIG. 2 is an example block diagram of the primary operational elements of a derating tool in accordance with one illustrative embodiment.

FIG. 2 is an example block diagram of the primary operational elements of a derating tool in accordance with one illustrative embodiment. As shown in FIG. 2, the derating tool 200 comprises a machine derating front-end engine 210 and an application derating front-end engine 220. The derating tool 200, and thus, the front-end engines 210 and 220, may be implemented, for example, as software instructions stored in one or more computer readable storage devices, e.g., memories, hard disk drives, flash memory drivers, solid state disks, CD-ROMs, DVDs, etc., that store the instructions for later retrieval and execution. These instructions may be retrieved from the one or more computer readable storage devices and then executed by one or data processing devices, e.g., processors or the like. However, it should be appreciated that a purely hardware embodiment or embodiments comprising a combination of hardware implemented algorithms and software implemented algorithms may be used without departing from the spirit and scope of the illustrative embodiments.

The machine derating front-end engine 210 comprises a profiler engine 212 and a residency analyzer 214. The machine derating front-end engine 210 receives as input, an application workload 240 as well as the new integrated circuit device design parameter file 230. The application workload 240 is a set of instructions to be executed on the new integrated circuit device having the design as specified in the new integrated circuit device design parameter file 230. The execution of the application workload 240 in this new integrated circuit device design is simulated by the machine derating front-end engine 210. The machine derating front-end engine 210 models soft errors at the machine or microarchitecture level using the information about the integrated circuit device design from the parameter file 230 and information about the application workload 240. That is, a simulation is executed by the machine derating front-end engine 210 which generates a machine or micro-architecture soft error rate (SER) faults in time (FIT) projection for the new integrated circuit device design. This simulation utilizes the profiler 212 to profile the application workload 240 to obtain information about the types and numbers of each type, of instructions executed as part of the application workload 240. The simulation further utilizes a residency analyzer 214 to determine residency statistics for elements of the new integrated circuit device design specified in the parameter file 230, e.g. a functional unit-wise latch profile 280. The residency statistics basically identify how much of the execution time of the application workload 240 is each functional unit in the design busy. The simulation performed by the machine derating front-end engine 210 may be executed on the same existing hardware 250 as the application derating front-end engine 220 operates or on a different data processing device. More details regarding one illustrative embodiment for implementing the machine derating front-end engine 210 will be provided hereafter with reference to FIGS. 3-6.

In addition to the machine derating performed by the machine derating front-end engine 210, the derating tool 200 provides an application derating front-end engine 220 which injects faults into an existing hardware 250. The existing hardware 250 may be an existing integrated circuit device that is sufficiently similar to the new integrated circuit device design that monitoring the existing hardware's operation with regard to the application workload 240, in view of injected faults, provides a good approximation of the operation how the new integrated circuit device design would operate under the same conditions with the same application workload 240. For example, in one illustrative embodiment, the integrated circuit device is a processor chip and the existing hardware 250 may be an existing processor chip in a same family of processor chips as the new processor chip design specified by the parameter file 230, e.g., an IBM P6 processor chip may be the existing hardware 250 while the parameter file 230 may specify the design of an IBM P7 processor chip that is in the same family of processor chips as the P6 processor chip, where a same "family" essentially means that the micro-architectures of the chips are sufficiently similar and the instruction set architectures are sufficient similar that they may be regarded as being related to one another. The existing hardware 250 utilizes a same or significantly similar instruction set architecture (ISA) as the new integrated circuit device design specified in the parameter file 230 so that the execution of the application workload 240 on the existing hardware 250 accurately approximates the execution of the same application workload 240 on the new integrated circuit device design 230.

With the application derating front-end engine 220, the application workload 240 is not simulated but actually executed on the existing hardware 250. The execution of this application workload 240 is initiated but then stopped, or interrupted, by the architected state reading engine 222 early in the execution to read the architected state of the application workload 240 in the existing hardware 250, e.g., register states and the like.

Having read the architected state at the initialization of the application workload 240, i.e. prior to the application workload 240 actually executing, the application derating front-end engine 220 injects one or more faults into the existing hardware 250 by modifying the architected state of one or more elements of the existing hardware 250 and writing the modified state back to the one or more elements of the existing hardware 250. The actual modification of the state of the selected element(s) is performed by an architected state modify and write engine 224 of the application derating front-end engine 220, for example. The particular elements whose state is modified may be specified in fault injection parameters 260 provided as input to the application derating front-end engine 220, i.e. a directed fault injection, or may be randomly or pseudo-randomly determined by the application derating front-end engine 220 in any suitable manner. Moreover, a combination of directed and random or pseudo-random selection of elements of the hardware 250 may be utilized as well. For example, the application derating front-end engine 220 may randomly select one or more registers in the hardware 250 to have their bit states flipped, i.e. a state that was a 0 is flipped to be a 1 or vice versa.

Once the fault(s) is/are injected into the hardware 250 in this way, the application workload 240 execution on the hardware 250 is restarted. At some time later, e.g., at a specified time interval, at conclusion of the execution of the application workload 240, and/or the like, the state of the hardware elements is read and stored in the storage 226. The state information obtained after injection of the fault is indicative of how the fault affects the execution of the application workload 240 and whether the injected fault is masked or not masked by the execution of the application. Thus, multiple sets of state information may be gathered during the execution of the application workload 240 so as to determine how the injected fault affects the operation of the hardware 250 with regard to the execution of the application workload 240.

It should be noted that during each application derating operation performed by the application derating front-end engine 220, a plurality of fault injections may be performed. Each fault injection may be a same fault injection, i.e. a same element whose state is modified to simulate a fault, or may be a different fault injection, a different element whose state is modified to simulate a different fault. Thus, for example, based on a particular time interval specified in the fault injection parameters 260, the execution of the application workload 240 on the hardware 250 may be interrupted periodically, the state of the hardware 250 may be read out by the architected state reading engine 222 and stored in the storage 226, and may then be modified and written by the architected state modify and write engine 224. This may simulate, for example, multiple impacts of particles, the effects of radiation, and the like, on the hardware 250 that may cause soft errors or transient errors to occur in the hardware 250.

The particular parameters for performing the fault injection are specified in the fault injection parameters input 260 that is provided to the application derating front-end engine 220. For example, these parameters may specify one or more elements, e.g., registers or the like, in the hardware 250 into which the fault is to be injected, that the fault injection is to be performed on one or more randomly or pseudo-randomly selected elements, a particular manner or algorithm for performing the selection, a time interval for injecting the fault(s) (the time interval may be fixed or variable), and other fault injection parameters that may be used to direct the way in which fault injection is performed.

The machine derating and application derating performed by the derating tool 200 may be performed multiple times to obtain statistical measures, e.g., probabilities, percentages, etc., with regard to the effects of soft errors and transient errors at the machine and application levels, e.g., statistical measures of masking/non-masking of soft errors/transient errors. This information is output to the backend engine 290 as the machine derating information 270 and application derating information 275. For example, the machine derating front-end engine 210 generates, via the hardware 250, or other data processing device (not shown) machine derating information 270 and functional unit-wise latch profile information 280 which are both input to the backend engine 290 to generate a machine derating soft error rate (SER) faults in time (FIT) projection component for the new integrated circuit device design. The application derating front-end engine 220 injects faults into the hardware 250 and determines the masking/non-masking of these faults at the application level to generate application derating information 275 which is input to the backend engine 290 to generate an application derating SER FIT projection component. These two components are combined to obtain a total SER FIT projection 295 for the new integrated circuit device design. For example, the SER FIT projection 295 may be a worst case SER determined based on a product of the number of latches and the per-latch FIT rate as determined from the machine derating and application derating information 270-275.

As mentioned above, the illustrative embodiments provide a unified tool 200 for performing both machine derating analysis and application derating analysis using existing hardware 250 at hardware speeds. That is, the application derating, which might otherwise be performed using software based simulation, is performed in actual existing hardware at hardware speeds. Furthermore, with the mechanisms of the illustrative embodiments both components of SER FITs projections are taken into consideration, i.e. machine derating and application derating, thereby providing a more comprehensive projection of the actual operation of the new integrated circuit device design.

As mentioned above, one component of the derating tool 200 is the machine derating front-end engine 210 which performs a machine level simulation of the integrated circuit device design defined by the parameter file 230. There may be many different ways to implement such a machine derating front-end engine 210, any of which are intended to be within the spirit and scope of the illustrative embodiments. FIGS. 3-6 are provided hereafter as an example of some illustrative embodiments in which a "phaser" mechanism is used to implement the machine derating front-end engine 210. An example of such a "phaser" front-end is described in commonly owned and co-pending U.S. patent application Ser. No. 12/243,427, which is hereby incorporated by reference.

As described in the co-pending U.S. patent application Ser. No. 12/243,427, the tool for modeling system level effects of soft errors at the machine level, i.e. the machine derating front-end engine 210, integrates device-level and component-level soft error rate (SER) analysis with micro-architecture level performance analysis tools during the early phase of integrated circuit device design, e.g., the concept phase of the design. For purposes of the description of the illustrative embodiments, it will be assumed that the integrated circuit device being designed is an integrated circuit (IC) chip. The integration of device-level and component-level SER analysis with microarchitecture-level performance analysis tools at the concept phase allows designers to study key performance-power-reliability trade-offs. In particular, besides the modeling tool of the illustrative embodiments projecting SER derating factors and corresponding SER FIT values for the IC chip and its various components, the modeling tool framework also allows the designers to undertake "what-if" evaluations and comparisons, with a focus on adopting various latches and cells from a design library in the various units based on their respective SER vulnerability characteristics. The modeling tool framework further allows an architecture definition team to decide on the exact style and level of micro-architectural redundancy that may be needed to achieve per-chip SER FIT targets.

In later stages of the design, as the design reaches the register transfer level (RTL) mode, the IC chip SER profile is refined, as more accurate information about the unit-wise latch distributions, latch types, and SER vulnerabilities of logic and latch elements become available. Though in these later design phases major micro-architecture paradigm changes are generally not made, the analysis derived from the modeling tool framework of the illustrative embodiments aids in adjusting the relative protection levels and latch-types across highlighted units of the IC chip design.

Figure 3:
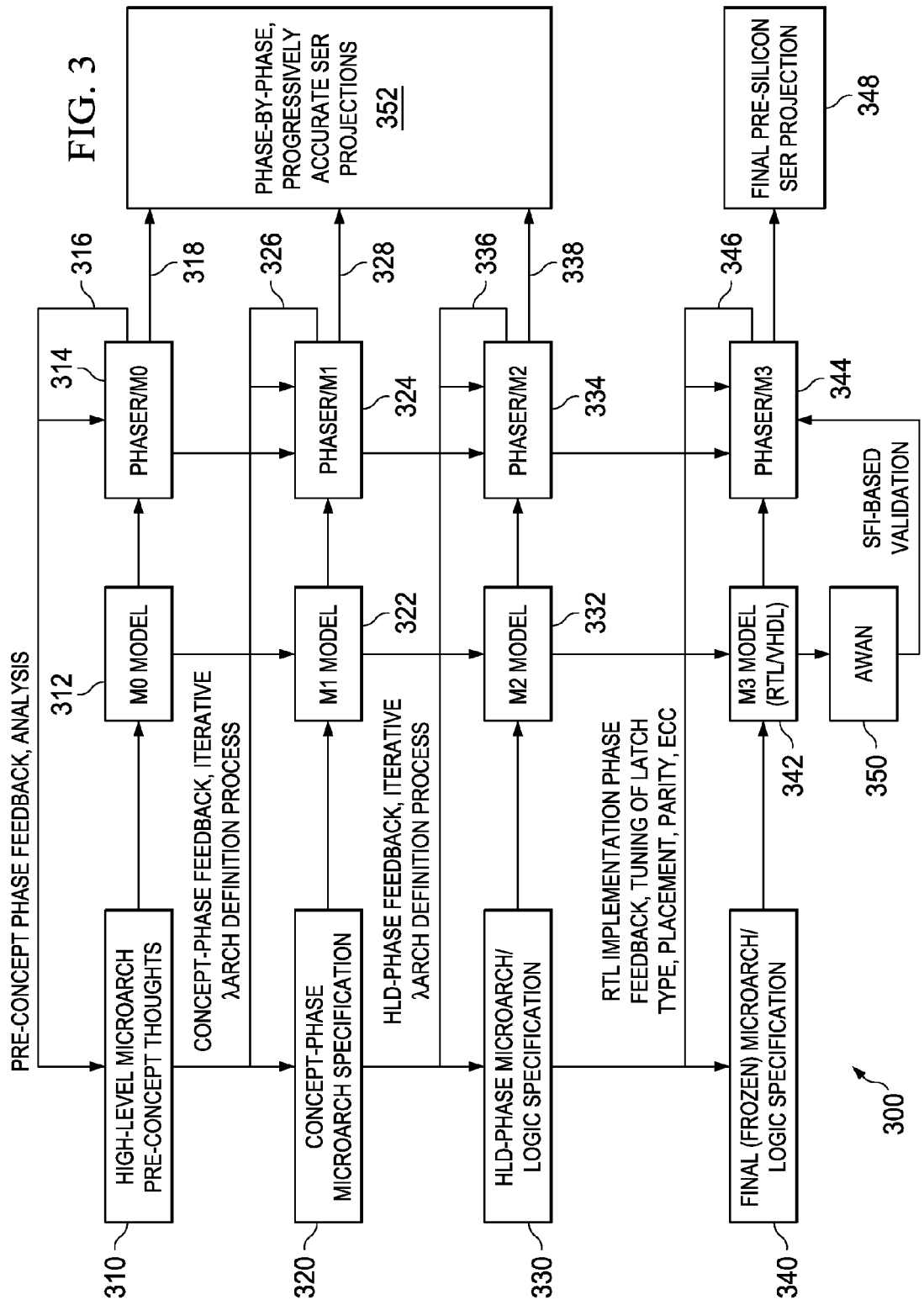
FIG. 3 presents a detailed overview of a framework of one illustrative embodiment of the phased multi-stage prediction modeling, evaluation, and estimation framework of soft error vulnerability at a machine microarchitecture level through the various stages of system design.

FIG. 3 presents a detailed overview of a framework 300 of one illustrative embodiment of the phased multi-stage prediction modeling, evaluation, and estimation framework of soft error vulnerability at a machine microarchitecture level through the various stages of system design. This framework 300 may be utilized as a machine derating front-end engine 210 of a derating tool 200 as shown in FIG. 2, for example. The main methodology behind each of the phases 310, 320, 330, and 340 in the framework 300 are similar with the additional impetus that as the design moves from the pre-concept phase 310 to the next higher phases 320, 330, and 340, respectively, the information available and its accuracy improves, making it possible for the modeling accuracy to keep improving. In particular, the projections and predictions made in the previous phase can be used in a loop-back manner to improve the next phase projections and predictions, and vice versa.

As illustrated in the framework 300 in FIG. 3, there are four basic models of the integrated circuit device under design, e.g., an IC chip for purposes of this description, around which the soft error rate (SER) modeling is focused at the various design phases. These particular models are: (a) the M0 model 312 at the pre-concept phase 310; (b) the M1 model 322 at the concept phase 320; (c) the M2 model 332 during the high-level design (HLD) phase 330; and (d) the M3 model 342 during the register transfer level (RTL) implementation phase 340. The four models M0, M1, M2, and M3, may be provided as parameter files, such as parameter file 230 in FIG. 2, for example. These four models, M0, M1, M2, and M3 have corresponding IC chip SER workload modeling engines: Phaser/M0 314, Phaser/M1 324, Phaser/M2 334, and Phaser/M3 344, where the latch/cell types and counts, with their corresponding vulnerabilities, are combined together with the active workload residencies of the chip or component to produce respective increasingly accurate SER projections 318, 328, 338, 348, and 352. At each of the Phaser/Mi components, with i=0, 1, 2, 3, a lateral iteration 316, 326, 336, and 346 of improving the raw SER modeling and workload residency aids the accuracy of the SER projection at that stage.

Workload residency is a measure of the opportune proportion of cycles during a workload execution for which bit-flip events could alter the program correctness. In effect, workload residency is a measure of a logic element's (average) susceptibility to soft errors; measuring the cycles during which the logic element is working on correct-path instruction execution which could affect the correctness of the workload output versus the total number of cycles of execution. The residency can be measured for logic elements, storage elements, etc. and may be measured at various levels of granularity from single transistors through larger accumulations (e.g. logical units, etc.). Residency is similar to the familiar metric of utilization, but with the additional restriction that only the utilized cycles in which the data stored or logic being computed could result in alterations of the final workload output (i.e. a soft error) are considered.

The M0 model 312 is an analytical performance model, e.g., a spreadsheet or the like, or a very early "cycle-approximate" simulator that is adapted from an earlier generation cycle-accurate M1 performance model 322. As the design definition progresses to the concept phase 320, the architecture team arrives at a more definite view of the processor core and chip-level micro-architecture. At this stage, the framework 300 leverages the M1 (cycle-accurate performance) model 322 for the core to build the SER analysis tool. Later, during the HDL phase 330, the M1 performance model 322 is replaced by a "latch-accurate" M2 model 332, where the inter-unit interfaces are accurately modeled in terms of the exact latch counts. The intra-unit execution semantics are still written in a behavioral format, e.g., using C/C++ type languages, as in the M1 model 322, for example. During the HDL phase 330 of the design, the corresponding chip SER workload modeling paradigm, Phaser/M2 334, is able to model the inter-unit error propagation effects more accurately since those interface latches and their switching activities are directly observable during the simulation of specific workloads.

During the RTL implementation phase 340, the framework SER analysis moves over to link up with the RTL (M3) model 342 which contains detailed logic, latch, and timing information for the full processor. In addition to VHDL cycle-accurate software simulation (which is rather slow), the framework 300 has the facility for using significantly accelerated AWAN hardware simulation 350 of the RTL model 342, which allows for running full benchmarks if necessary, at the RTL detail level. AWAN hardware simulation 350 is described in Ludden et al. "Functional Verification of the POWER4 Microprocessor and POWER4 Multiprocessor Systems," IBM Journal of Research & Development, Vol. 46, No. 1, pages 53-76, 2002, which is hereby incorporated by reference. At the RTL implementation phase 340 of the design, as the RTL approaches full functionality, the framework 300 can also leverage validation/calibration support from statistical fault injection (SFI) approaches.

The details of the Phaser/Mi components of the framework 300, where i=0, 1, 2, 3, will now be described. Since the various phases of the framework 300 are not fundamentally different when considered from a high level, the methodology of the framework 300 will be illustrated through an in-depth generalized discussion of Phaser/M1. It is assumed that the design has a cycle-accurate M1 microarchitecture simulator and preliminary design VHDL code available, with clear knowledge and choices of the various technology elements, e.g., latches, combinational logic, and memory cells, along with the technology parameters that govern their behavior.

As Li et al. has shown in "Architecture-Level Soft Error Analysis: Examining the Limits of Common Assumptions," Proceedings of the 37th Annual IEEE/IFIP International Conference on Dependable Systems and Networks, Edinburgh, U.K., 2007, pages 266-275, which is hereby incorporated by reference, for practical ranges of the native per-bit SERs observable at sea level, and for modeled systems with tens of components (units), a simpler, post-processing approach that uses an instrumented simulator to collect average workload residency statistics per workload run, can yield sufficiently accurate per-unit and total system SER. Such an approach is based on two steps. In a first step, a per-unit average architectural vulnerability factor (AVF), as described in Mukherjee et al., "A Systematic Methodology to Compute the Architectural Vulnerability Factors for a High-Performance Microprocessor," Proceedings of the 36th Annual IEEE/ACM International Symposium on Microarchitecture," San Diego, Calif., 2003, pages 29-40, which is hereby incorporated by reference, is estimated. The AVF is then multiplied by the unit maximum (unmasked or raw) SER to project the real, i.e. derated, SER of the unit as actually manifested in program behavior. In a second step, unit-level error rates are added to derive the chip-level SER value, which is referred to generally as the sum of failure rates (SOFRs). However, it is important to stress that the accuracy of the unit-wise and total manifested failure rates depends on how the AVFs are collected.

In the Phaser/Mi components of the illustrative embodiments, a post-processing approach is used to collect all the required average residency statistics at the end of a workload run. Those statistics are then combined with the detailed information of per-unit latch distributions of specific types and protection levels, along with native technological data related to raw per-bit SER values. Thus, the illustrative embodiments use new data (workload residency, etc.) and metrics (raw FITS, etc.) to obtain a new measure of the IC design (i.e. susceptibility to SER) than has been previously known in post processing mechanisms. The AVF/SOFR approach estimates the SER of an IC chip or system in two steps. The first step, i.e. the AVF step, estimates the SER of the individual components under the basic assumption that the probability of failure is uniform across a program execution. Hence, the SER of a given component in a processor chip is simply the fraction of time it holds useful work and/or data multiplied by the raw SER of the component. This fraction of time is referred to as the component value of data residency. The second step, i.e. the SOFR step, estimates the SER of the entire IC chip or system by adding together the individual SER values of the constituent components under the general assumption that the inter-arrival time for failures is exponentially distributed.

Depending on the particular design phase, the methodology derives the residency factors from the corresponding simulation model, e.g., M0 312, M1 322, M2 332, or M3 342 in FIG. 3. In one illustrative embodiment, the framework 300 uses a detailed method to calculate the architectural residency factors that can be implemented more practically than known methodologies while preserving accuracy. For example, a systematic method to monitor only useful register file residencies, i.e., those that contribute to actual instruction completion and modification of the architected register and memory state, is utilized. The term "architected" refers to the components of the machine that are accessible by software including memory, register files, special-purpose registers, and the like. The measured residency data is combined with the various latch, logic, and cell raw SERs of the targeted IC chip in a systematic manner to project the de-rating factors as well as the overall SER.

Figure 4:
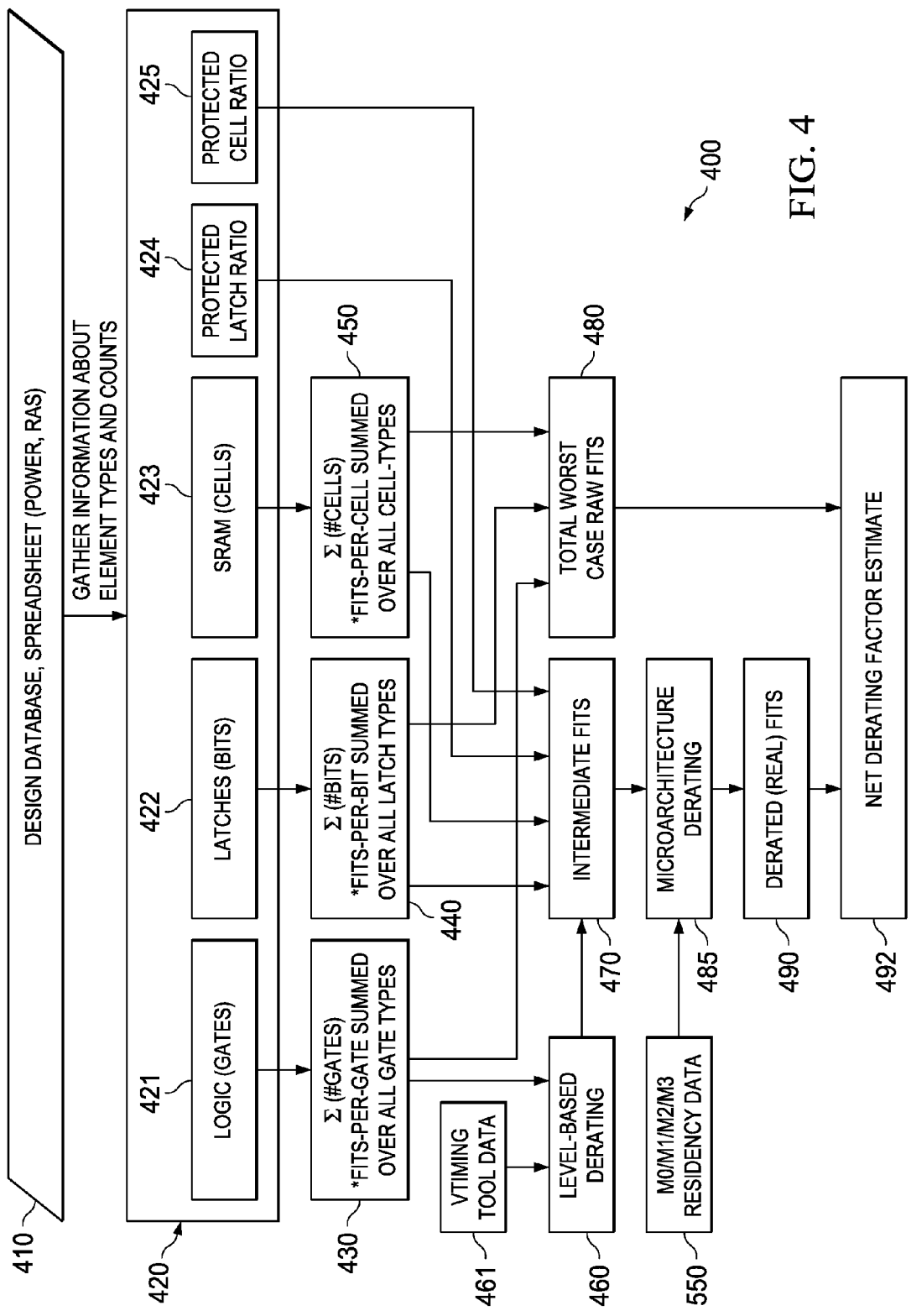
FIG. 4 is a flowchart representation of a process of estimating the failure in time and rating of a chip in accordance with one illustrative embodiment.

Referring now to FIG. 4, a flowchart representation of a process of estimating the failure in time and rating of a chip in accordance with one illustrative embodiment is depicted. The process outlined in FIG. 4 may be performed, for example, by the Phaser/Mi in FIG. 3, for example. A quick inspection of the process 400 demonstrates that a considerable amount of data and a number of factors from various sources are factored and merged together to achieve a realistic SER and de-rating prediction model. Generally, the framework 300 revolves around two major approaches: (1) estimating the raw SER of the targeted IC chip or system; and (2) deriving the average residency of the typical workload executing on the same IC chip or system. These two derivations are used to accurately predict the de-rating factor and the projected SER of the IC chip or system under study.

The raw SER of an IC chip is defined as the expected total SER assuming that the chip is busy 100% of the time and that every bit or cell upset that occurs during its operation leads to a manifested soft error. Accurate raw SER modeling of an IC chip or its components utilizes an in-depth knowledge of the constituent latches, array cells, and combinational logic with respect to counts and types as well as their associated vulnerabilities to soft errors. As illustrated by the process 400 in FIG. 4, the framework 300 of the illustrative embodiments gathers this element and technology information 420 of the logic 421, latch 422, and SRAM 423 counts, as well as type data, from a design database 410, which may be maintained, for example, in a storage device associated with the data processing system. In addition, information on the ratio of latches 424 and memory cells 425 protected against errors, capable of recovering from errors, as well as those that will only signal the occurrence of errors, are also taken from the design database 410. Since the framework 300 is multi-phase, it is expected that this data is updated frequently as more accurate design data becomes available with the maturity of the design.

The Phaser/Mi component modeling computes the contribution of SER by each of the elements, e.g., logic, latches, SRAM, and the like. As shown in the process 400 in FIG. 4, the raw SER contribution of combinational logic 430 is basically the summation of all gates multiplied by the respective gate's native raw FIT. Essentially, the raw SER/FIT values are simple measures of the susceptibility of the basic circuit/device structures, given the technological parameters of the device (i.e. sizes of gate, oxide thickness, voltage level, doping, etc.) to be affected by various quanta of "noise" (i.e. energy that is not specifically intended data value). In the development of a digital circuit in a specific technology (i.e. 45 nm CMOS process) there is a technology team that defines a set of basic elements (the device library, which includes bit latches, basic gates, mux elements, etc.) that are used to implement the desired design. This design library team also runs various experiments, including electrical simulations, etc. to determine the raw susceptibility of the devices to these noise effects (of which an external strike by a galactic particle, e.g., an alpha particle, etc. is one possible source). Devices that are run closer to the threshold voltage, or with narrower gate channels, etc. are more susceptible, and the designers have the option to choose among a variety of different devices with different SER/FIT characteristics (among others, e.g., speed, power, etc.).

With regard to the mechanisms of the illustrative embodiments, the generation of raw SER/FIT information is a precursor to the operation of the mechanisms of the illustrative embodiments. This information is generally kept in the form of design database (i.e. as attributes in the design library, or externally in a database, etc.) and may or may not change occasionally as the technology becomes better characterized, or as new experiments on the basic circuit data provide better information about the raw FIT of devices. This data is available from each technology foundry/fabrication facility, for each design library supported. The illustrative embodiments take in this raw SER/FIT information and operate upon it in the manner described herein.

The raw SER contribution of latches 440 is the summation of all latch bits multiplied by the respective latch bit's native raw FIT. The raw SER contribution of SRAM or storage structures 450 is the summation of all memory/storage cells multiplied by the respective cell's native raw FIT. The summation of these values 430, 440, and 450 give the total worst case Raw FITs 480 of the IC chip or system under study.

However, it should be noted that without even taking a workload running on the IC chip or system into account, there are still elements which do not, or cannot, contribute to the raw SER of the IC chip. The basic reasoning is that some of the elements 420 in the IC chip are protected against soft errors, such as through error correcting codes (ECC) or parity checking, and can either recover from an occurrence of a soft error or be able to signal such occurrence for the necessary mitigating processes to proceed. In addition, there is empirical established knowledge that due to logic-level masking effects in a combinational logic chain or cone, soft error upset events on gates in levels 4 and beyond generally do not contribute to manifested errors in the receiving latch bank in real microprocessor pipelined logic paths. Hence, the total worst case Raw FITs discussed above can be further de-rated or masked based on the recognition of elements within the elements 420 that do not, or cannot, contribute to the raw SER of the IC chip or system.

As previously mentioned above, the term "de-rating" or "de-rate" refers to the portion of time an IC chip unit or structure (whether logic or storage) is not in use, or during which it is operating but in a manner that cannot affect an executing workload's correctness. Therefore, it can be said that the structure or unit is not susceptible to soft errors during that time period. This is termed de-rating because it reduces the overall opportunity for soft error vulnerability in a unit or structure from a baseline or raw SER value (derived from the underlying unit/structure hardware primitives, which does not take the specific implementation usage into account). For example, a microprocessor unit with a de-rating factor of 75% over a given workload execution implies that such a unit is susceptible to errors only 25% of the total execution time of the workload run, which factor is used to reduce the baseline per-cycle susceptibility by that proportion. De-rating factors result from a wide set of behaviors, from low-level electrical factors (e.g., the latch duty cycle) through high-level effects (e.g., the instruction set architecture and programming conventions). Overall, de-rating refers to any of the factors that reduce the raw SER from the base value.

To further de-rate or mask the total worst case Raw FITs, the design planned protected latch ratio 424 and protected cell ratio 425 data, gathered from the design database 410, as well as information on the gate levels in the various logic chains, are used. In particular, the combinational logic chain SER 430 is de-rated further by knowing the actual levels and composition counts of logic gates and being able to extract the proportion of the zero to three gate type levels and counts that matter. For the levels and counts of the combinational logic gates within the logic chains, such data is gathered by applying a VHDL dissecting tool, e.g., a Vtiming tool 461, on the evolving register transfer level (RTL) model of the IC chip or system. An example of a Vtiming tool 461 that may be utilized with the mechanisms of the illustrative embodiments is described in Kudva et al., "Early Performance Prediction," Proceedings of the Workshop on Complexity—Effective Design: Held in Conjunction with the 32nd International Symposium on Computer Architecture, Madison, Wis., 2005, which is hereby incorporated by reference.

The Vtiming tool 461, which may be part of the profiler 212 in FIG. 2, for example, scans the VHDL description of the IC chip or component and gathers statistics about the number and types of logic gates within each level of a given combinational logic chain. The Vtiming tool 461 is able to provide an estimate of the length and number of gates in various levels of logic of a cone of logic in the early stage RTL description without the requirement of a gate level design or synthesis. Based on the number of signals that are in the input set of an output or state signal, an estimate of the number and sensitivity of combinational logic in the design can be made by the Vtiming tool 461. Using this information, the raw FITs contributed by the combinational logic 430 are further de-rated or masked 460 by considering only the gates in the level zero to level three of the design. The de-rated combinational logic raw FITs 460 are then combined with the latch and SRAM raw FITs 440 and 450, both de-rated by the protected latch ratio 424 and protected cell ratio 450, respectively. The resulting intermediate FITs 470 is considered purely micro-architecture dependent, before the effects of workload behavior are considered.

This far the raw SER of an IC chip or system are modeled assuming that all bit flips are of consequence. However, it is known that for the typical micro-architecture or IC chip/system, the workload residency of useful data is well less than 100% across all modeled units within the IC chip or system. Hence, to better estimate the de-rating factor or project the manifested FIT, statistics on the residency of relevant live data values within the IC chip or system are gathered. Such residency values are collected as accurately as possible on the IC chip or system under study through its available simulator as it executes a typical representative workload.

Figure 5:
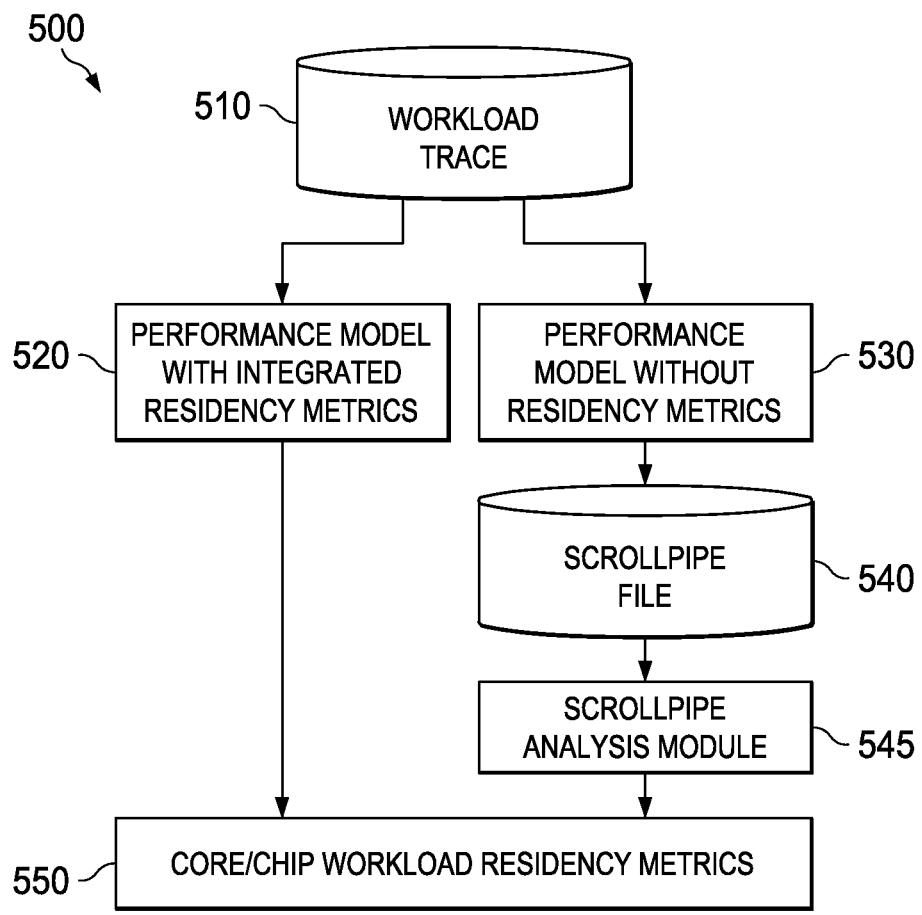
FIG. 5 is a flowchart representation illustrating two approaches for estimating the micro-architectural workload residency of a chip in accordance with one illustrative embodiment.
Figure 6:
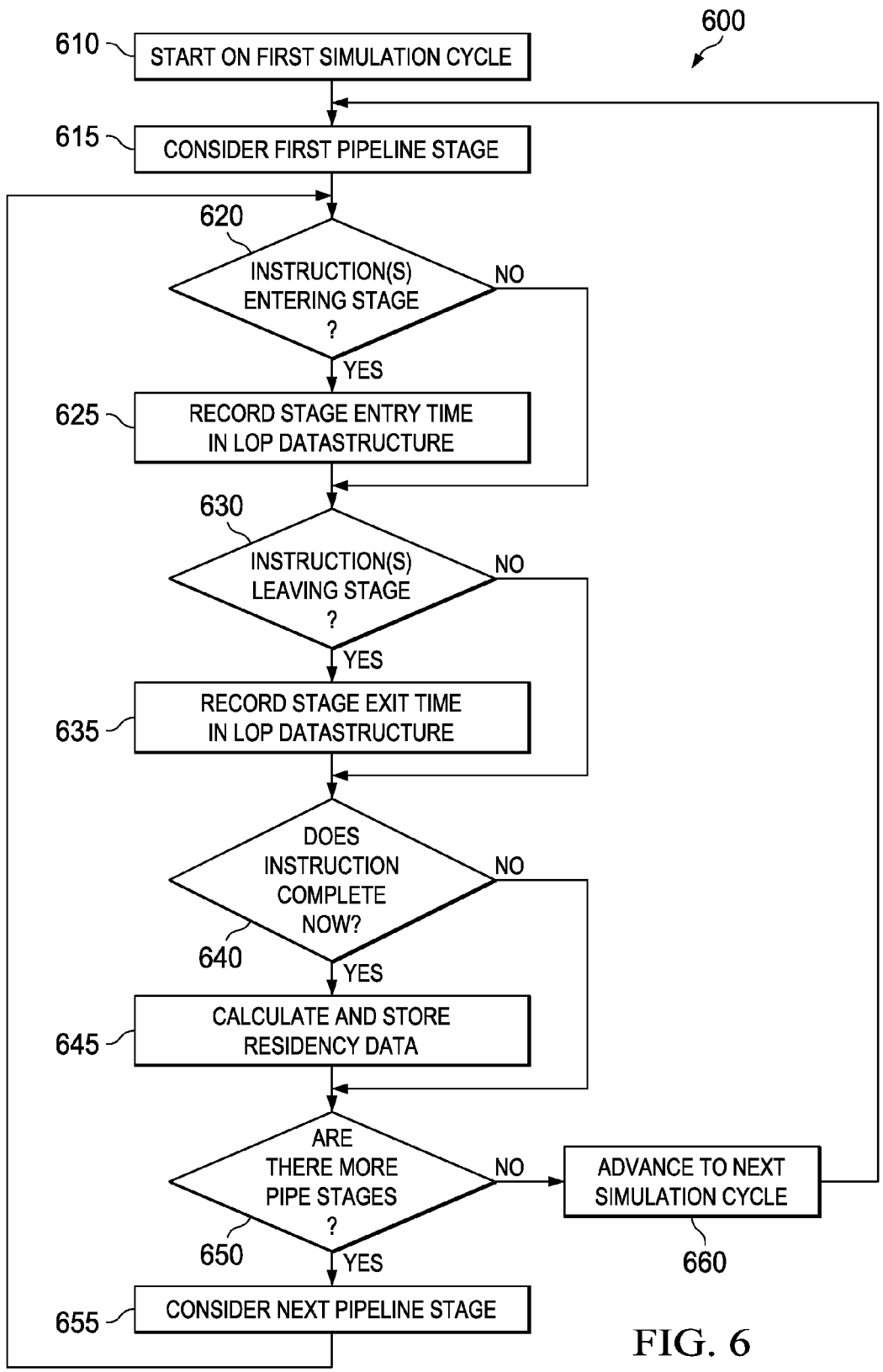
FIG. 6 is a flowchart representation illustrating an in-depth micro-architectural residency gathering of an IC chip through a simulator in accordance with one illustrative embodiment.

The residency data or metrics collection process is illustrated in FIGS. 5 and 6. With the workload residency data or metrics available 550, the intermediate FITs 470 value is micro-architecturally de-rated 485 to the real (or manifested) FITs 490. A comparison between the de-rated (real) FITs 490 and the total worst case Raw FITs 480 generates the net de-rating factor estimate 492.

It should be noted that the methodology as described has been with a focus on silent data corruption (SDC)-related SER manifested at the program output. The description here has focused on predicting an early stage (necessarily conservative) bound on the SDC-specific SER, or equivalently the machine, de-rating factor applicable to SDC-specific error rate estimations. However, those skilled in the art would realize that the methodology allows for breaking the micro-architectural de-rating under study into various groups of de-rating: de-rating due to corrected error class, de-rating due to checkstop error class, de-rating due to micro-architecturally vanished error class, de-rating due to incorrect architected state error class, and the like.

With reference now to FIG. 5, a flowchart representation illustrating two approaches for estimating the micro-architectural workload residency of a chip in accordance with one illustrative embodiment is depicted. The operations outlined in FIG. 5 may be implemented, for example, in the Mi models, where i=0, 1, 2, 3, e.g., models 312, 322, 332, and 342 in FIG. 3, which a particular emphasis on 322 for purposes of this description.

Structures in a microprocessor IC chip can be broadly classified into two major groups: logic and storage. Logic structures can be defined to be the various data and control processing units on the IC chip that are made up of combinational logic gates and latches. Typical examples of on-chip logic structures then include the functional units, e.g., fixed-point unit (FXU) pipelined logic datapath (with its associated control logic) and the instruction decode unit (IDU) logic. Storage is defined to be the various structures that hold data values, such as the queues, register files, and other SRAM macros, for example. Of course, latches may also serve as staging and data-hold resources, especially during stalls in a pipeline flow. In this case, depending on how such stalls are implemented in relation to the clock-gating functionality within the pipeline, certain latch banks may also be categorized within the storage class. However, the residency modeling for such pipeline latches is simpler than register files and arrays and is better treated under the logic category.

Workload residency modeling 500, as depicted in FIG. 5, which may be performed, for example, by the residency analyzer 214 in FIG. 2 for example, attempts to measure the opportune proportion of cycles during a workload execution for which bit-flip events could alter program correctness. Hence, to accurately capture such residency data, the focus includes only the true path of program execution. For example, dataflow-centric soft errors on a wrongly speculated path during program execution cannot alter program output. Similarly, rejected or flushed executions, dead instructions, NOPs (no operations), and performance-enhancing instructions (e.g., those related to data pre-fetch) do not contribute to SER-induced data corruption. In effect, for logic structures, the question that is asked is, during what fraction of the cycles is there an operation that uses a particular logic structure in such a manner as to lead to actual completed instructions? For storage structures, the question is, during what fraction of cycles is the storage resource holding a value that will subsequently be used in the true execution path?

When it comes to SER modeling, there are often attempts to use microarchitecture utilization as a proxy for actual residency. However, a close examination of utilization and residency in a complex microprocessor pipeline shows a potentially significant difference between the two. When utilization is used, there are often corrective factors that may be applied (e.g., use of average stall event or dead instruction statistics) to approach a better residency average. However, in general, there are many more sources of de-rating imposed by the micro-architecture-workload pair. The effective correction factors to the computed utilization data in proxy for residency (due to all sources) may be awkward and error-prone to derive individually via average statistical behavior alone. Hence, with the framework 300 of the illustrative embodiments, the micro-architecture simulator is accurately instrumented for gathering actual residency data as shown in FIG. 5.

As the process 500 in FIG. 5 portrays, there are two main ways whereby overall residency data can be gathered using the micro-architecture or IC chip simulator. One approach is to directly instrument 520 the IC chip or micro-architecture simulator (often written for performance data gathering) with the residency metrics data gathering instructions. In that case, when the simulator is fed with a workload trace 510, the necessary residency data 550 is gathered. Another approach for gathering residency data such as when the source performance simulator is not available for instrumentation 530, is to resort to capturing a scroll pipe output 540 of a performance run and using an analysis module 545 to gather the residency data from such an output. A scroll pipe output is a representation of the timing state of instructions or internal operations moving through the microprocessor pipeline. It is, effectively, a visualization medium that (usually graphically) represents on a cycle-by-cycle basis the possible locations in a pipeline of various internal data (i.e. instructions, cache access data, control signals) and, for each such location in use, what instruction, datum, etc. is using that location on each cycle. Given the capability to visualize the utilization of the pipeline, one can then try to estimate the residency using various means.

With reference now to FIG. 6, a flowchart representation illustrating an in-depth micro-architectural residency gathering of an IC chip through a simulator in accordance with one illustrative embodiment is depicted. The operation outlined in FIG. 6 may be an in-depth illustration of the operations performed as part of elements 520 or 545 in FIG. 5, which again may be performed by the Mi models. The process 600 in FIG. 6 illustrates an example of the detailed residency gathering operations within a performance simulator or a scroll pipe analyzer. Basically, each instruction records significant event times during simulated execution, and these per-instruction metrics are gathered when an instruction completes. Starting at the first cycle of simulation 610, and for each subsequent cycle of the simulation, the analysis tool starts at the first pipeline stage 615 and considers each pipeline stage in turn 655. For each pipeline stage, a determination is made as to whether an instruction is first entering that pipeline stage 620. If there is an instruction entering that stage, the time of the instruction's entry into the stage (i.e., the current cycle of simulation) is recorded in the instruction's internal data structure (e.g., a lop data structure) 625. A determination is then made as to whether an instruction is leaving the pipeline stage 630. If so, then the time of the instruction's exit from the stage (i.e., the current cycle of simulation) is recorded in the instruction's internal data structure (e.g., a lop data structure) 635.

A determination is made as to whether an instruction completes on this cycle 640. If so, then the residency data contributed by this instruction is calculated and recorded in the global residency tracking data-structures of the analysis tool 645. If there are more pipeline stages 650, then the analysis continues with the next pipeline stage 655, otherwise the analysis moves on to the next cycle of the simulation 660 wherein the scan of pipeline stages is begun anew for that cycle of simulation. In this way, the contribution of each instruction throughout the simulation can be recorded with the instruction, and is promoted to the global residency statistics only when the instruction completes (and therefore proves to have been from a final execution pass on the correct execution path).

As can be seen from the foregoing, illustrative embodiments present a phased methodology framework that allows progressive refinement of soft-error related de-rating and failure in time analysis as the design progresses from (pre)concept phase to high-level design phase and the RTL implementation phase. By the nature of the illustrative embodiments, the methodology renders itself to a pipelined evaluative framework that allows quicker start of SER analysis for a next generation microprocessor IC chip design starting off from the present phase of a current design, enabling higher design/evaluation throughput in a multi-chip design process.

As discussed above, in addition to the machine derating performed using the mechanisms described above with regard to FIGS. 3-6 as one example implementation of the machine derating front-end engine of the illustrative embodiments, the illustrative embodiments further utilize an application derating front-end engine 220 that determines SER FIT projections at the application level. This is done by injecting faults into an actual hardware device 250 that represents the new integrated circuit device design and then monitoring and collecting information from this hardware device 250 to determine SER FIT projections as the hardware device 250 executes the application workload.

In one illustrative embodiment, the injection of faults into the hardware device 250 utilizes a modified process trace (ptrace) tool. Ptrace is a UNIX operating system tool that is used to perform program debugging. The ptrace tool allows one process to control another process, thereby enabling the controller process to inspect and manipulate the internal state of the controlled process. A ptrace call allows the ptrace tool to be attached to another process and control the process to which it is attached including manipulation of its file descriptors, memory, and registers. The ptrace tool can single-step through the target process, i.e. the controlled process, code and observe system calls and signals.

In one illustrative embodiment, the ptrace tool is attached to the application workload 240 and used to obtain the architectural state information for the hardware device 250, e.g., the register states and memory states associated with the application workload 240. The ptrace tool allows one to look at the architected state, which means the underlying processor's architected register state, as visible to the particular application workload 240, as well as the state of the memory allocated to that particular application workload 240. Existing ptrace tools are used to read the architected state at user-specified breakpoints in a program, in order to debug the execution of the program. The illustrative embodiments use of the ptrace tool to read the architected state, but then to also write back a modified state and allow continued execution so as to understand the behavior of the application under an injected error. Repeated such random injection experiments allows one to estimate the application derating component for transient error (e.g., SER) analysis. Thus, the illustrative embodiments provide additional, new mechanisms built on top of the basic ptrace tool in order to achieve an entirely new functional capability not previously known with existing ptrace tools.

Thus, with the illustrative embodiments, the ptrace tool is used to obtain the architectural state information for the hardware device 250 and this architectural state is then written out to a storage device. The application derating front-end engine 220 selects one or more register/memory elements to have their states modified to thereby inject a fault. The particular register/memory element(s) that are selected may be selected using a directed selection operation where they are predetermined or a random/pseudo-random selection operation.

The state(s) of the selected register/memory element(s) is/are modified to thereby inject a fault that simulates a soft error or transient error. The actual modification of the state(s) may be performed by using the ptrace tool to view and read out the state, modify it and then write it back to the register/memory word. Thereafter, the fault injector, e.g., the ptrace tool in this example, is detached from the process, e.g., the application workload 240 in this example, and the process is permitted to continue execution.

At some time later, such as at a next interval at which the ptrace tool is again called, at the end of execution of the application workload 240, or the like, the state of the various register/memory elements is again read and stored. This later architectural state information may be compared against a "golden" architectural state that identifies what the architectural state of the hardware 250 should be when the application workload 240 is executed properly on the hardware 250. Any discrepancies between the "golden" architectural state and the architectural state read from the hardware 250 after injection of the fault, may be determined to be due to the injected fault. That is, the execution of a program or application on a computer is a deterministic process, in that, multiple executions (without any deliberately injected or spuriously induced error) would result in exactly the same sequence of architected state transitions, (as visible to the program or application) culminating in the same final state at the end of program execution. Therefore any mismatch against the error-free execution's "golden" architected state(s), at any point after the deliberate error or fault injection, can be attributed to that injected error or fault. When there is a difference between the golden architectural state and the actual detected architectural state, and this difference can be traced to the injected fault, then the difference is considered to be a soft error. If there is no difference between the golden architectural state and the detected architectural state, then it can be determined that the injected fault did not cause a soft error to occur at the application level.

Thus, in summary, using the mechanisms of the illustrative embodiments, in a single-error random injection methodology, over the execution period of the application, the fault injection operation may take the form of:

(1) a directed or random instant is chosen for error or fault injection;

(2) at that instant, the execution is frozen, and one of the elements (selected by way of a directed selection or a random/pseudo-random selection) of the application-visible architected state (i.e. architected register or memory state) is read out;

(3) one of the data bits of the selected state element is flipped in value and written back to the register or memory word;

(4) execution is then resumed and the effect of the injected error or fault is observed.

This fault injection, detection of resulting architectural state, and comparison may be performed repeatedly. From this repeated operation, a soft error rate can be determined, i.e. a number of times an injected fault causes a soft error to occur in the application workload execution. These soft error rates (SERs) may be combined, by the backend engine 290, with the SER values determined from the machine derating to generate a total SER FIT projection for the integrated circuit device design. That is, a large number of experiments (e.g., several thousand) may be done to collect statistics about "what happened" as a result of the error or fault injections. The probabilities of various effects may then be calculated, e.g., the probability that the application execution is totally unaffected in terms of correctness and completions, the probability that the application completes but with output data errors, the probability that the application terminates prematurely, or the like.

For example, suppose 10,000 such single-error injections are done, to observe the effect on the application, and suppose only the end of execution application state is examined—in cases where the application actually completes. Out of these experiments, suppose 2000 result in silent data corruption (SDC), 1000 result in premature termination—i.e. the execution is not able to complete, 200 result in the program entering a "hung" state—either an infinite loop, or stuck at the same point without further progress, and the remaining 6800 experiments result in no effect whatsoever—i.e. the program or application completes without any corruption of the final output or application-visible architected state. Then, the probability of SDC failure caused by an architected state's single bit flip incident is computed as 2000/10000 or 0.2. The architectural derating (masking) factor, with regard only to SDC is 8000/10,000 or 80%. Now suppose the micro-architecture (machine) derating factor is computed using the other part of the illustrative embodiments as being 75%, which means that the probability of a random micro-architectural state latch or buffer bit flip causing a corruption of the application-visible architected state is 0.25 or 25%. Then, the probability of a random latch flip causing an SDC failure at the program output is 0.25*0.2=0.05. From this probability, and a knowledge of the actual "raw" SER FITs for the processor/system, the actual, derated SER FITs (with regard to SDC failures) can be computed. Taking the reciprocal of the derated SER FITs gives us the mean time to failure or MTTF.

Thus, the illustrative embodiments provide a unified derating tool for performing both machine derating and application derating analysis so as to determine a total SER FITs projection for an integrated circuit device design. The unified derating tool performs simulation of the integrated circuit device design to determine a machine level derating while performing an application derating operation using existing hardware that uses a same instruction set architecture and approximates the operation of the integrated circuit device design at hardware speeds. This speeds up the derating operation by eliminating the need to perform application derating using a full design simulation.

Figure 7:
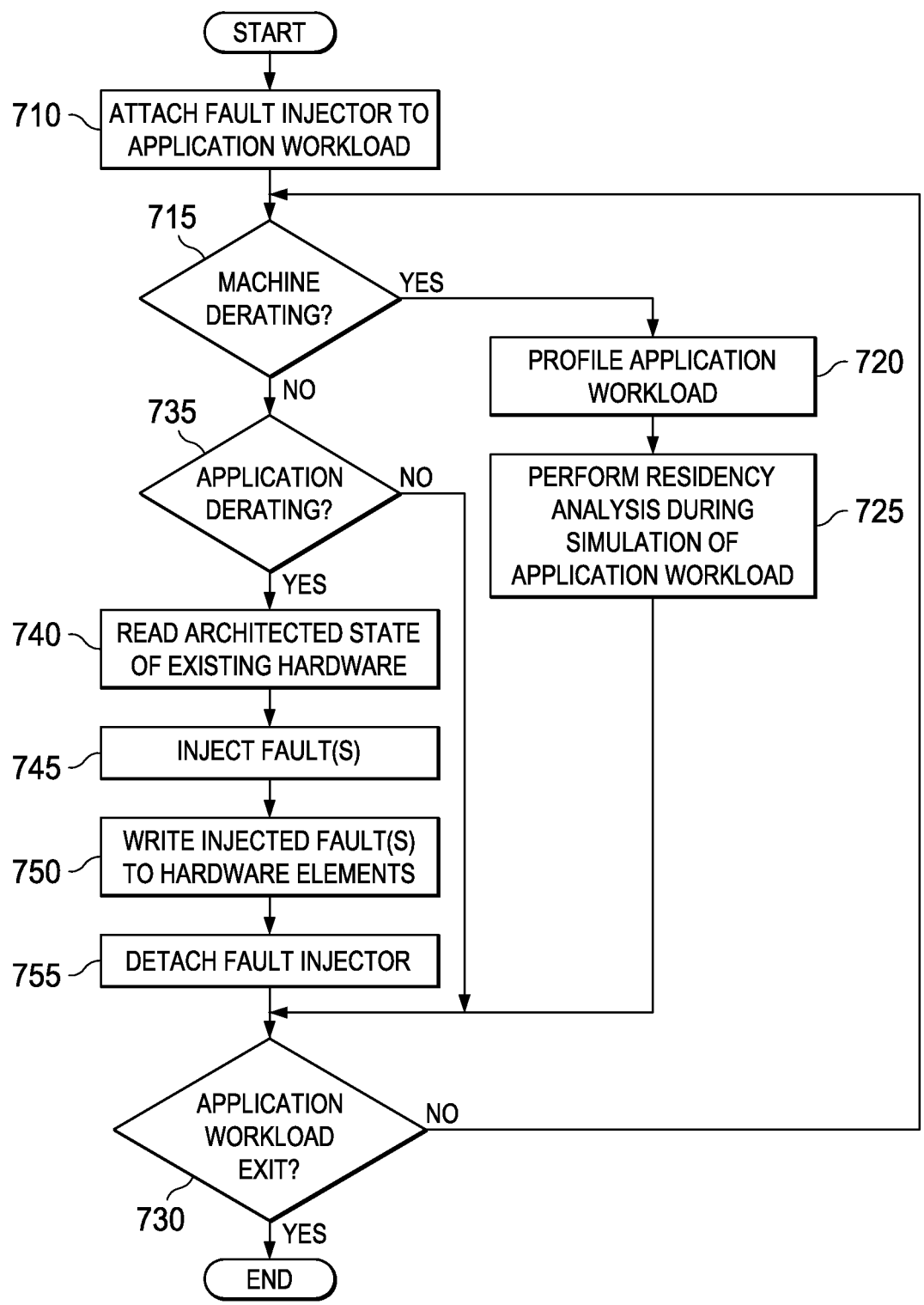
FIG. 7 is a flowchart outlining an example operation for performing machine derating and application derating projections in accordance with one illustrative embodiment.

FIG. 7 is a flowchart outlining an example operation for performing machine derating and application derating projections in accordance with one illustrative embodiment. The operation outlined in FIG. 7 may be implemented, for example, by the derating tool 200 in FIG. 2, for example. Thus, various operations set forth in FIG. 7 may be implemented in special purpose hardware, software executing on one or more data processing devices or other general purpose hardware mechanisms, and/or any combination of special purpose hardware and software executing on general purpose hardware mechanisms.

As shown in FIG. 7, the operation starts with attaching a ptrace tool or other fault injector to the application workload (step 710). The ptrace tool is used attached initially to profile the execution characteristics of the application or program in question as well as to be used in performing application derating as described above and hereafter. A determination is made as to whether a machine derating operation is to be performed (step 715). If so, then the application workload is profiled to determine the composition of instructions in the application workload (step 720). A residency analyzer is then used to determine residency information during a simulation of the execution of the application workload on the integrated circuit device design (step 725). A determination is then made as to whether the application workload has exited or not (step 730). If not, the operation returns to step 715. If the application workload has exited, then the operation terminates.

Returning to step 715, if a machine derating operation is not to be performed, then a determination is made as to whether an application derating operation is to be performed (step 735). If so, then the architected state of existing hardware upon which the application workload is going to be executed is read and stored (step 740). One or more faults are injected into the hardware (step 745) and the injected fault states are written to the hardware elements (step 750). The fault injector is then detached (step 755). Thereafter, a determination is made as to whether the application workload has exited or not (step 730) and if so, then the operation terminates; otherwise the operation returns to step 715. The operation outlined in FIG. 7 may be repeated multiple times to obtain a statistical representation of SER FIT projections for an integrated circuit device design.

The operation outlined in FIG. 7 assumes that both the MD and AD operations are performed using a single host hardware processor and thus, a determination as to whether MD or AD operations are to be performed is utilized. However, in other illustrative embodiments, such as those in which multiple processors in a host system are utilized, the MD and AD operations may be performed in parallel, in which case such a decision or branching operation becomes unnecessary.

FIG. 7 illustrates the operation for performing the MD and AD testing operations. These MD and AD testing operations result in MD and AD factor data that may be converted to probability information for various types of conditions, e.g., silent data corruption, hung states, no corruption, etc. These probability values may then be used, along with raw SER FIT values, to generate derated SER FIT values. These derated SER FIT values may then be used to direct modification of a hardware design.

Figure 8:
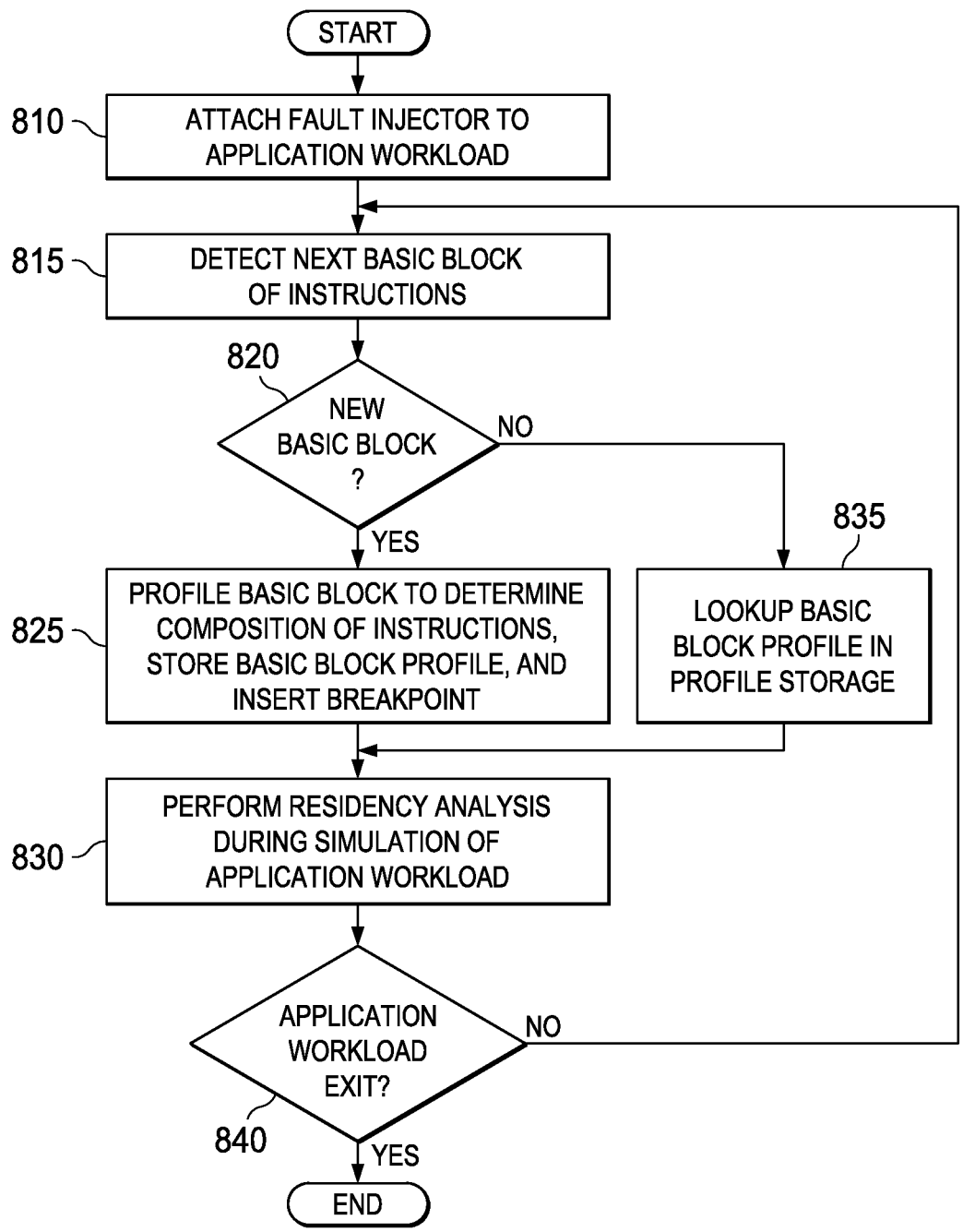
FIG. 8 is a flowchart outlining an example operation for performing machine derating in accordance with one illustrative embodiment.

FIG. 8 is a flowchart outlining an example operation for performing machine derating in accordance with one illustrative embodiment. The operation outlined in FIG. 8 may be implemented, for example, by the machine derating front-end engine 210 in FIG. 2.

As shown in FIG. 8, the operation starts with a ptrace tool or other fault injector being attached to the application workload (step 810). A next basic block of instructions in the application workload is detected, where a "basic block" is a set of instructions in the application workload that terminates in a branch instruction (step 815). A determination is made as to whether this is a new basic block or a basic block that has already been analyzed for machine derating purposes (step 820). This determination may be made based on a data structure, such as a linked list or table data structure, that stores identifiers of currently found basic blocks. As basic blocks are found during the operation, their identifiers are stored in the data structure and a lookup operation may be performed using this data structure to determine whether a basic block.

If the basic block is a new basic block that has not previously been analyzed for machine derating purposes, the basic block is profiled to determine the instruction composition of the basic block, the profile is stored for later use, and a breakpoint is added to the basic block (step 825). The breakpoint may be added in the basic block of the source code so that the ptrace tool can be used to detect the end of the basic block during the dynamic analysis of the application or program execution. Residency analysis is then performed on the basic block using a simulation of the integrated circuit device design to generate residency statistics (step 830).

If the basic block is not a new basic block, then a lookup of the profile of the basic block is performed (step 835). The operation then goes to step 830 where residency analysis is performed. A determination is then made as to whether the application workload execution has exited (step 840). If not, the operation returns to step 815 where a next basic block of instructions in the application workload is detected and the operation is repeated for the next basic block. If the application workload executed does exit, the operation terminates. It should be noted that the residency analysis performed as part of the machine derating operation is a primary operation for computing the MD factor. Once the MD and AD factors are computed, then the raw SER FITs can be derated to produce the final, derated SER FITs. The derated SER FITs are then inverted (via a reciprocal function) to compute the mean time to failure (MTTF), as previously explained. It should also be noted that, in the calculation of MD factors, using the mechanisms of the illustrative embodiments, repeated experiments are not needed, i.e. a single analysis run is sufficient. The AD operation involves repeated, iterative experiments in order to draw statistically meaningful conclusions about the AD factor.

Figure 9:
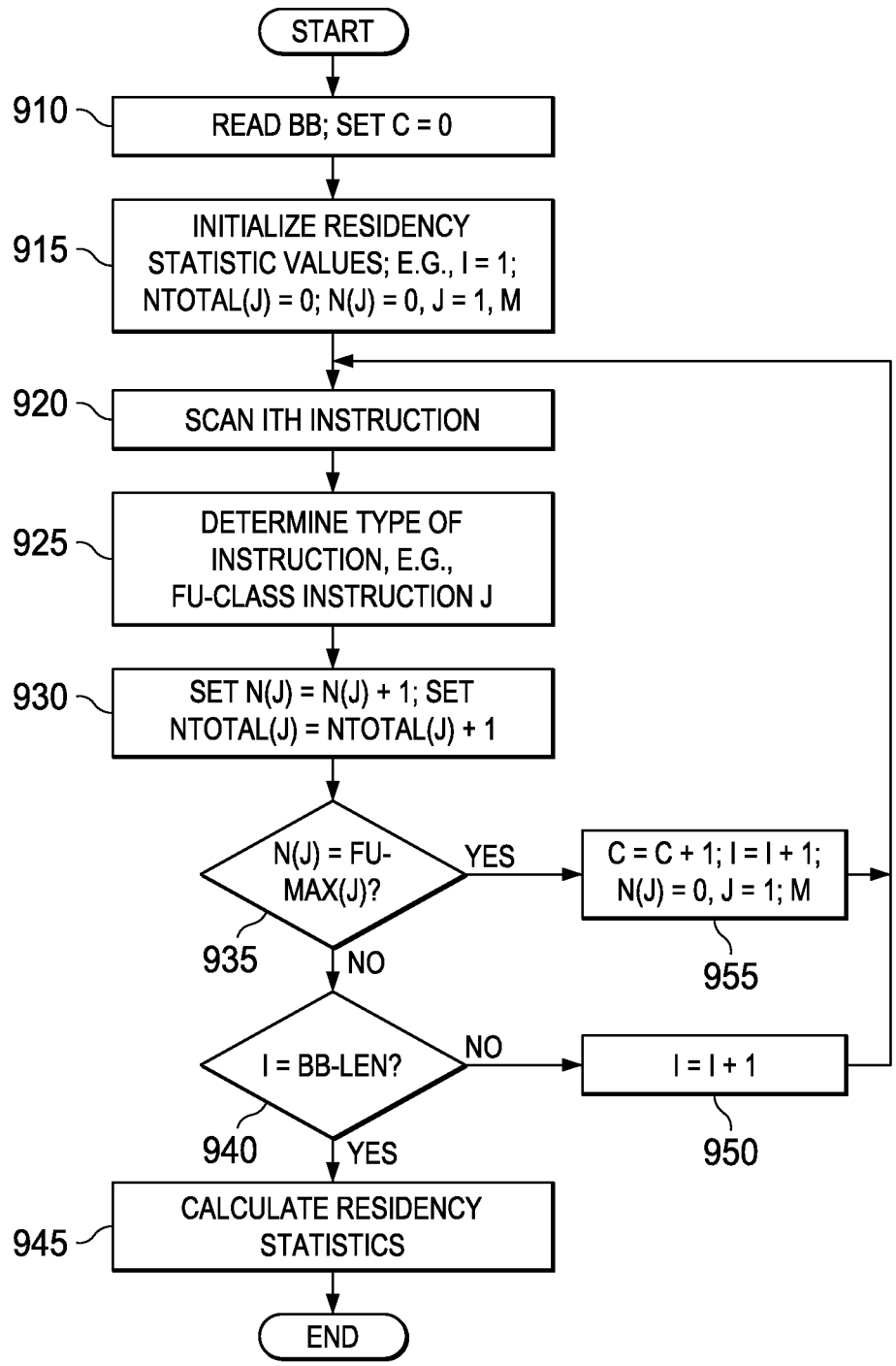
FIG. 9 is a flowchart outlining an example operation for performing residency analysis for a basic block in accordance with one illustrative embodiment.

FIG. 9 is a flowchart outlining an example operation for performing residency analysis for a basic block in accordance with one illustrative embodiment. The operation outlined in FIG. 9 may be implemented, for example, by the residency analyzer 214 of the machine derating front-end engine 210 in FIG. 2.

As shown in FIG. 9, the operation starts by reading the basic block that is being analyzed and the cycle count C is set to 0 (step 910). The values for calculating residency statistics are initialized (step 915). For example, the instruction number i is initialized to 1, the total number N(j) of instructions for a particular instruction type j is initialized to 0, to type of instruction j is initialized to 1, and the value for the number of functional units types (or classes) M is set to an initial value based on the integrated circuit device design.

The ith instruction is then scanned (step 920) and a determination is made as to the type of instruction, i.e. what functional unit type is used to execute the instruction, e.g., a floating point unit, branch execution unit, fixed point execution unit, or the like (step 925). A corresponding total number of instructions in the basic block of the particular instruction type of the ith instruction is incremented (step 930), e.g., if the ith instruction is of a functional unit type/class j, then the total instructions of the functional unit type/class j N(j) is incremented, i.e. N(j)=N(j)+1.

A determination is then made as to whether the total number of instructions of the particular functional unit type j is equal to an issue bandwidth limit for the functional unit type, i.e. FU-max(j) (step 935). The issue bandwidth limit indicates a maximum number of instructions of a particular type that may be dispatched or issued per processor cycle. For example, if the integrated circuit device design comprises two load/store units, a maximum of two load/store instructions per cycle may be dispatched.

If the issue bandwidth limit for the functional unjit type is not equal to the total number of instructions of the particular functional unit type j, then a determination is made as to whether the value of i is equal to the basic block length BB-len (step 940). If the value of i is equal to the BB-len, i.e. instruction i is the last instruction in the basic block, then residency statistics for the basic block are calculated (step 945). For example, these residency statistics may include cycles per instruction (CPI), instructions per cycle (IPC), floating point execution unit utilization, load/store unit utilization, fixed point execution unit utilization, and the like. For example, CPI may be calculated as the number of cycles C divided by the basic block length with IPC being the inverse of CPI. The various utilization statistics may be calculated as the number of instructions of the corresponding functional unit type divided by the product of the basic block length and the instructions per cycle. Other statistical measures of utilization and residency may be calculated without departing from the spirit and scope of the illustrative embodiments.

If the value of i is not equal to the basic block length BB-len, then the value of i is iterated (step 950) and the operation returns to step 920 where the next instruction is scanned. If the total number of instructions for the particular functional unit type is equal to the instruction bandwidth for the functional unit type, i.e. FU-max(j) (step 935), then the number of cycles is incremented, the value of i is incremented, and the values of N(j) and j are initialized (step 955). The operation then returns to step 920. It should be appreciated that the residency analysis operation outlined in FIG. 9 may be implemented repeatedly for each basic block in the application workload.

Figure 10:
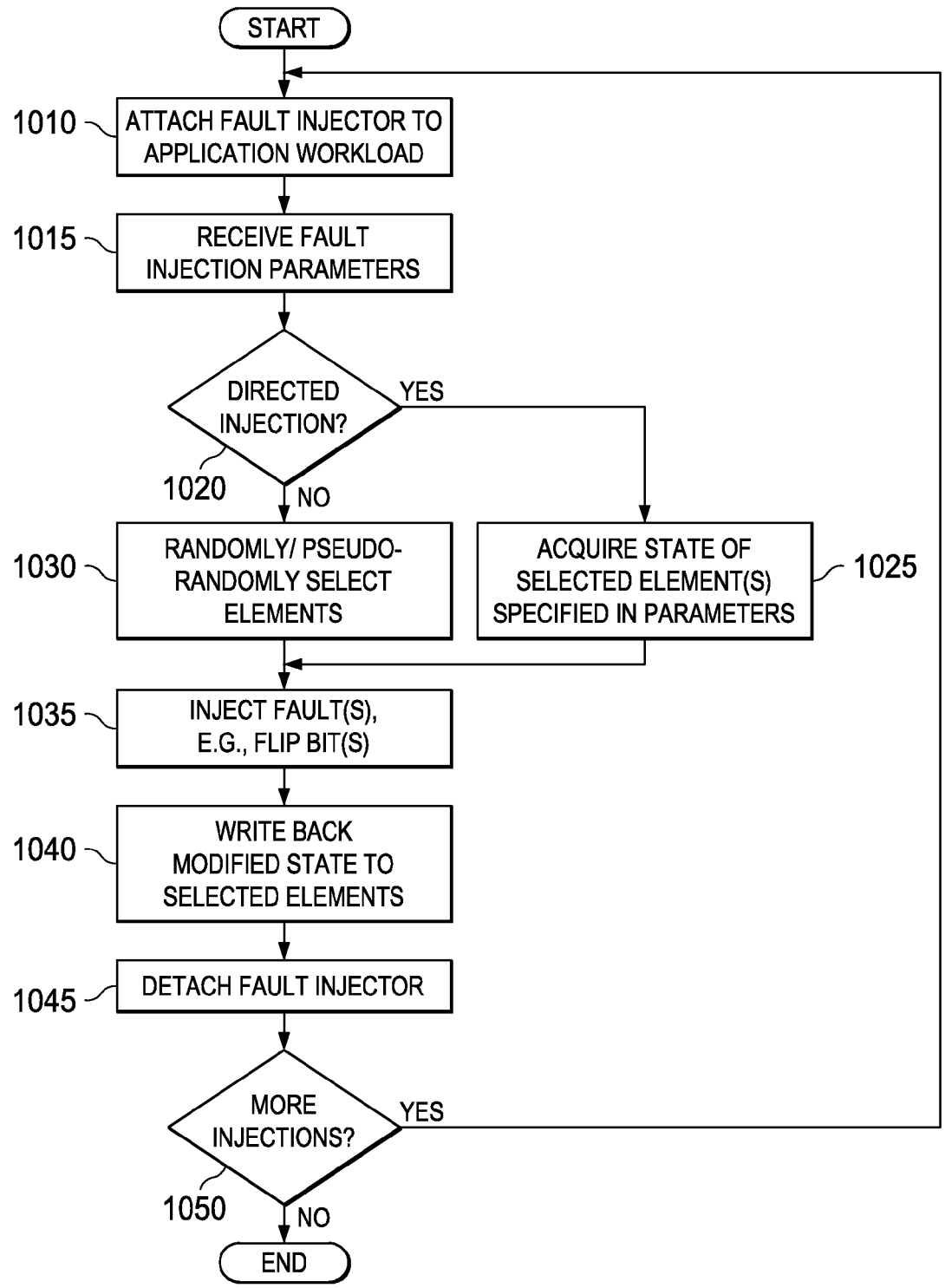
FIG. 10 is a flowchart outlining an example operation for performing application derating in accordance with one illustrative embodiment.

FIG. 10 is a flowchart outlining an example operation for performing application derating in accordance with one illustrative embodiment. The operation shown in FIG. 10 may be implemented, for example, by the application derating front-end engine 220 in FIG. 2.

As shown in FIG. 10, the operation starts by attaching a ptrace tool or other fault injector to the application workload (step 1010). Fault injection parameters are then received (step 1015) and a determination is made as to whether the fault injection is a directed fault injection (step 1020). If so, then the state(s) of the integrated circuit element(s) into which the fault is to be injected is/are acquired (step 1025). If the fault injection is not a directed fault injection, then one or more integrated circuit element(s) are selected either randomly or pseudo-randomly and their corresponding state(s) are acquired (step 1030). One or more bits of the selected integrated circuit element(s) are then flipped (step 1035) and the resulting state of the integrated circuit element(s) is written back to the integrated circuit element(s) (step 1040). The ptrace tool or fault injector is then detached from the application workload (step 1045) and a determination is made as to whether additional fault injections should be performed (step 1050). For example, each application may need to be executed many times, e.g., thousands of times, in order to draw statistically meaningful conclusions about a particular fault injection experiment. Thus, this iterative loop shows the same fault injection experiment being repeated many times, especially for random injection experiments. For directed injection experiments, multiple iterative runs may not be needed if a particular instant of injection and a particular data bit is somehow the only object of interest.

If additional fault injections should be performed with the ptrace tool being re-attached to the application workload, the operation returns to step 1010. If no more fault injections are to be performed, the operation terminates. The results of this operation may be used to generate an AD factor calculation that may be combined with the MD factor calculation and raw SER FIT values to derive derated SER FIT values which may be inverted to generate MTTF values. This information may then be used to direct hardware redesign efforts.

As with the other operations of the other flowcharts, this operation may be repeated many times in order to obtain a statistical representation of the manifestation of injected faults in the results of the execution of the application workload from an application level.

Figure 11:
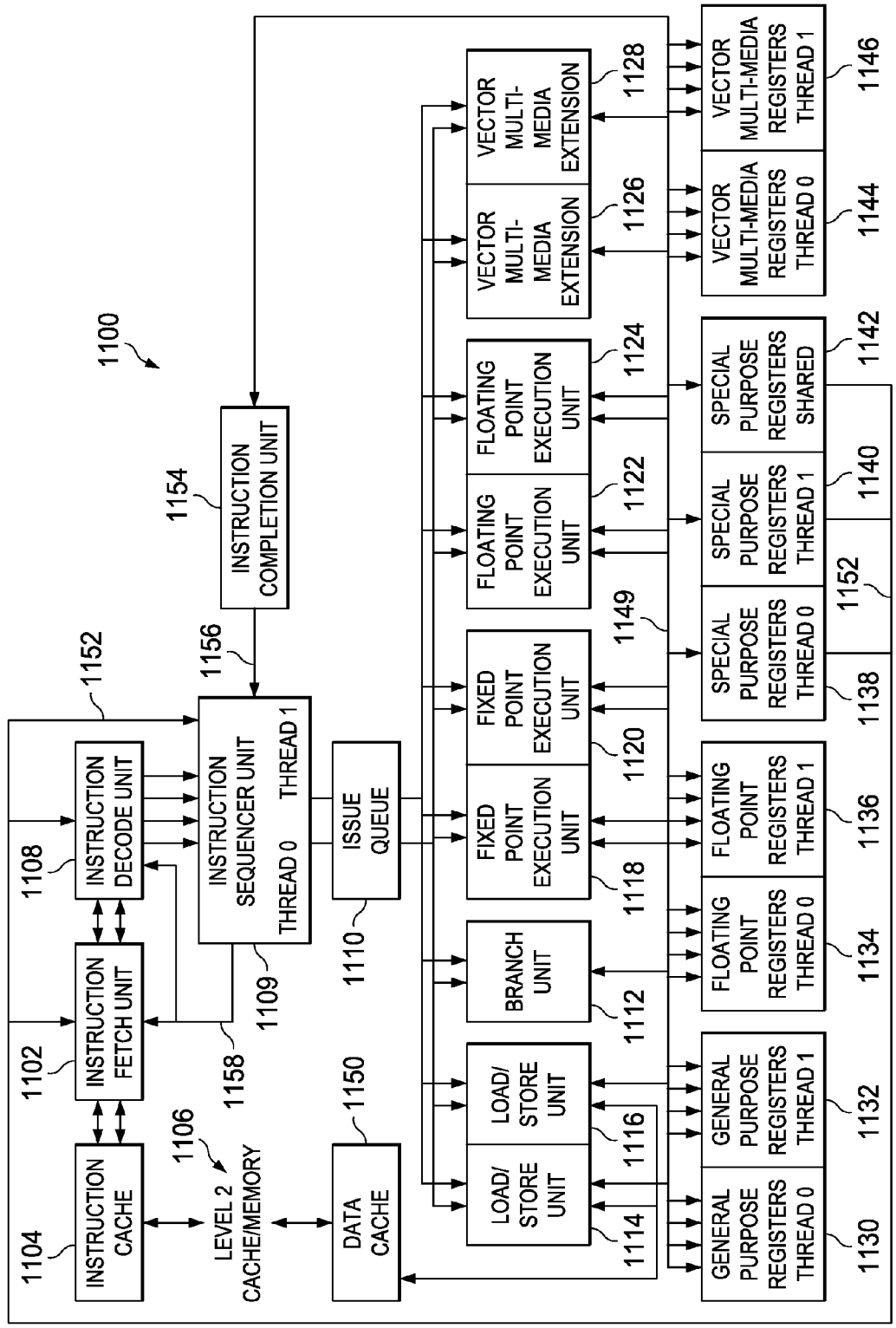
FIG. 11 is an exemplary block diagram of a conventional dual threaded processor in which aspects of the present invention may be implemented in accordance with an illustrative embodiment.

The illustrative embodiments may be utilized in many different types of data processing environments. In order to provide a context for the description of the specific elements and functionality of the illustrative embodiments, FIG. 11 is an example environment in which aspects of the illustrative embodiments may be implemented. It should be appreciated that FIG. 11 is only an example and is not intended to assert or imply any limitation with regard to the environments in which aspects or embodiments of the present invention may be implemented. Many modifications to the depicted environment may be made without departing from the spirit and scope of the present invention.

Referring to FIG. 11, an exemplary block diagram of a dual threaded processor design showing functional units and registers is depicted in accordance with an illustrative embodiment. Processor 1100 may be implemented as processing unit in a data processing system, for example, in these illustrative examples. Processor 1100 comprises a single integrated circuit superscalar microprocessor with dual-thread simultaneous multi-threading (SMT) that may also be operated in a single threaded mode. Accordingly, as discussed further herein below, processor 1100 includes various units, registers, buffers, memories, and other sections, all of which are formed by integrated circuitry. Also, in an illustrative embodiment, processor 1100 operates according to reduced instruction set computer (RISC) techniques.

As shown in FIG. 11, instruction fetch unit (IFU) 1102 connects to instruction cache 1104. Instruction cache 1104 holds instructions for multiple programs (threads) to be executed. Instruction cache 1104 also has an interface to level 2 (L2) cache/memory 1106. IFU 1102 requests instructions from instruction cache 1104 according to an instruction address, and passes instructions to instruction decode unit 1108. In an illustrative embodiment, IFU 1102 may request multiple instructions from instruction cache 1104 for up to two threads at the same time. Instruction decode unit 1108 decodes multiple instructions for up to two threads at the same time and passes decoded instructions to instruction sequencer unit (ISU) 1109.

Processor 1100 may also include issue queue 1110, which receives decoded instructions from ISU 1109. Instructions are stored in the issue queue 1110 while awaiting dispatch to the appropriate execution units. For an out-of order processor to operate in an in-order manner, ISU 1109 may selectively issue instructions quickly using false dependencies between each instruction. If the instruction does not produce data, such as in a read after write dependency, ISU 1109 may add an additional source operand (also referred to as a consumer) per instruction to point to the previous target instruction (also referred to as a producer). Issue queue 1110, when issuing the producer, may then wakeup the consumer for issue. By introducing false dependencies, a chain of dependent instructions may then be created, whereas the instructions may then be issued only in-order. ISU 1109 uses the added consumer for instruction scheduling purposes and the instructions, when executed, do not actually use the data from the added dependency. Once ISU 1109 selectively adds any required false dependencies, then issue queue 1110 takes over and issues the instructions in order for each thread, and outputs or issues instructions for each thread to execution units 1112, 1114, 1116, 1118, 1120, 1122, 1124, 1126, and 1128 of the processor. This process will be described in more detail in the following description.

In an illustrative embodiment, the execution units of the processor may include branch unit 1112, load/store units (LSUA) 1114 and (LSUB) 1116, fixed point execution units (FXUA) 1118 and (FXUB) 1120, floating point execution units (FPUA) 1122 and (FPUB) 1124, and vector multimedia extension units (VMXA) 1126 and (VMXB) 1128. Execution units 1112, 1114, 1116, 1118, 1120, 1122, 1124, 1126, and 1128 are fully shared across both threads, meaning that execution units 1112, 1114, 1116, 1118, 1120, 1122, 1124, 1126, and 1128 may receive instructions from either or both threads. The processor includes multiple register sets 1130, 1132, 1134, 1136, 1138, 1140, 1142, 1144, and 1146, which may also be referred to as architected register files (ARFs).

An ARF is a file where completed data is stored once an instruction has completed execution. ARFs 1130, 1132, 1134, 1136, 1138, 1140, 1142, 1144, and 1146 may store data separately for each of the two threads and by the type of instruction, namely general purpose registers (GPRs) 1130 and 1132, floating point registers (FPRs) 1134 and 1136, special purpose registers (SPRs) 1138 and 1140, and vector registers (VRs) 1144 and 1146. Separately storing completed data by type and by thread assists in reducing processor contention while processing instructions.

The processor additionally includes a set of shared special purpose registers (SPR) 1142 for holding program states, such as an instruction pointer, stack pointer, or processor status word, which may be used on instructions from either or both threads. Execution units 1112, 1114, 1116, 1118, 1120, 1122, 1124, 1126, and 1128 are connected to ARFs 1130, 1132, 1134, 1136, 1138, 1140, 1142, 1144, and 1146 through simplified internal bus structure 1149.

In order to execute a floating point instruction, FPUA 1122 and FPUB 1124 retrieves register source operand information, which is input data required to execute an instruction, from FPRs 1134 and 1136, if the instruction data required to execute the instruction is complete or if the data has passed the point of flushing in the pipeline. Complete data is data that has been generated by an execution unit once an instruction has completed execution and is stored in an ARF, such as ARFs 1130, 1132, 1134, 1136, 1138, 1140, 1142, 1144, and 1146. Incomplete data is data that has been generated during instruction execution where the instruction has not completed execution. FPUA 1122 and FPUB 1124 input their data according to which thread each executing instruction belongs to. For example, FPUA 1122 inputs completed data to FPR 1134 and FPUB 1124 inputs completed data to FPR 1136, because FPUA 1122, FPUB 1124, and FPRs 1134 and 1136 are thread specific.

During execution of an instruction, FPUA 1122 and FPUB 1124 output their destination register operand data, or instruction data generated during execution of the instruction, to FPRs 1134 and 1136 when the instruction has passed the point of flushing in the pipeline. During execution of an instruction, FXUA 1118, FXUB 1120, LSUA 1114, and LSUB 1116 output their destination register operand data, or instruction data generated during execution of the instruction, to GPRs 1130 and 1132 when the instruction has passed the point of flushing in the pipeline. During execution of a subset of instructions, FXUA 1118, FXUB 1120, and branch unit 1112 output their destination register operand data to SPRs 1138, 1140, and 1142 when the instruction has passed the point of flushing in the pipeline. Program states, such as an instruction pointer, stack pointer, or processor status word, stored in SPRs 1138 and 1140 indicate thread priority 1152 to ISU 1109. During execution of an instruction, VMXA 1126 and VMXB 1128 output their destination register operand data to VRs 1144 and 1146 when the instruction has passed the point of flushing in the pipeline.

Data cache 1150 may also have associated with it a non-cacheable unit (not shown) which accepts data from the processor and writes it directly to level 2 cache/memory 1106. In this way, the non-cacheable unit bypasses the coherency protocols required for storage to cache.

In response to the instructions input from instruction cache 1104 and decoded by instruction decode unit 1108, ISU 1109 selectively dispatches the instructions to issue queue 1110 and then onto execution units 1112, 1114, 1116, 1118, 1120, 1122, 1124, 1126, and 1128 with regard to instruction type and thread. In turn, execution units 1112, 1114, 1116, 1118, 1120, 1122, 1124, 1126, and 1128 execute one or more instructions of a particular class or type of instructions. For example, FXUA 1118 and FXUB 1120 execute fixed point mathematical operations on register source operands, such as addition, subtraction, ANDing, ORing and XORing. FPUA 1122 and FPUB 1124 execute floating point mathematical operations on register source operands, such as floating point multiplication and division. LSUA 1114 and LSUB 1116 execute load and store instructions, which move operand data between data cache 1150 and ARFs 1130, 1132, 1134, and 1136. VMXA 1126 and VMXB 1128 execute single instruction operations that include multiple data. Branch unit 1112 executes branch instructions which conditionally alter the flow of execution through a program by modifying the instruction address used by IFU 1102 to request instructions from instruction cache 1104.

Instruction completion unit 1154 monitors internal bus structure 1149 to determine when instructions executing in execution units 1112, 1114, 1116, 1118, 1120, 1122, 1124, 1126, and 1128 are finished writing their operand results to ARFs 1130, 1132, 1134, 1136, 1138, 1140, 1142, 1144, and 1146. Instructions executed by branch unit 1112, FXUA 1118, FXUB 1120, LSUA 1114, and LSUB 1116 require the same number of cycles to execute, while instructions executed by FPUA 1122, FPUB 1124, VMXA 1126, and VMXB 1128 require a variable, and a larger number of cycles to execute. Therefore, instructions that are grouped together and start executing at the same time do not necessarily finish executing at the same time. "Completion" of an instruction means that the instruction is finishing executing in one of execution units 1112, 1114, 1116, 1118, 1120, 1122, 1124, 1126, or 1128, has passed the point of flushing, and all older instructions have already been updated in the architected state, since instructions have to be completed in order. Hence, the instruction is now ready to complete and update the architected state, which means updating the final state of the data as the instruction has been completed. The architected state can only be updated in order, that is, instructions have to be completed in order and the completed data has to be updated as each instruction completes.

Instruction completion unit 1154 monitors for the completion of instructions, and sends control information 1156 to ISU 1109 to notify ISU 1109 that more groups of instructions can be dispatched to execution units 1112, 1114, 1116, 1118, 1120, 1122, 1124, 1126, and 1128. ISU 1109 sends dispatch signal 1158, which serves as a throttle to bring more instructions down the pipeline to the dispatch unit, to IFU 1102 and instruction decode unit 1108 to indicate that it is ready to receive more decoded instructions. While processor 1100 provides one detailed description of a single integrated circuit superscalar microprocessor with dual-thread simultaneous multi-threading (SMT) that may also be operated in a single threaded mode, the illustrative embodiments are not limited to such microprocessors. That is, the illustrative embodiments may be implemented in any type of processor using a pipeline technology.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for predicting effects of soft errors on an integrated circuit device design, comprising:
configuring the data processing system to implement a unified derating tool, wherein the unified derating tool comprises a machine derating front-end engine used to generate machine derating information for the integrated circuit device design, and an application derating front-end engine used to generate application derating information for the integrated circuit device design;
executing in the data processing system, by the unified derating tool, the machine derating front-end engine on a simulation of the integrated circuit device design to generate the machine derating information;
executing in the data processing system, by the milled derating tool, the application derating front-end engine to execute an application workload on existing hardware and inject a fault into the existing hardware during the execution of the application workload on the existing hardware to generate the application derating information, wherein the application workload is not simulated but actually executed on the existing hardware, wherein the integrated circuit device design comprises a new processor chip design, and wherein the existing hardware comprises an existing fabricated processor chip in a same family of processor chips as the new processor ship design; and
combining, by the data processing system, the machine derating information with the application derating information to generate at least one soft error rate (SER) value for the integrated circuit device design.

2. The method of claim 1, wherein the machine derating information comprises one or more machine derating factors identifying a relative measure of faults masked, recovered, or otherwise not detectable in an output of the integrated circuit device, design, and wherein the application derating information comprises one or more application derating factors identifying a relative measure, at a level of an application-visible state, of faults masked, recovered, or otherwise not detectable in an output of the application.

3. The method of claim 1, wherein executing the machine derating front-end engine on the simulation of the integrated circuit device design comprises using an integrated circuit device design parameter file, the application workload, a profiler engine, and a residency analyzer to obtain the machine derating information for the integrated circuit device design, wherein the profiler engine obtains information about the execution of the application workload on the simulation of the integrated circuit device design as defined by the integrated circuit device design parameter file, and wherein the residency analyzer generates residency statistics for elements of the integrated circuit device design, wherein the residency statistics identify how much execution time of the execution of the application workload is attributable to each of the elements.

4. The method of claim 1, wherein executing the application derating front-end engine comprises using an application fault injector to inject the fault into the existing hardware during the execution of the application workload by:
stopping the execution of the application workload on the existing hardware;
reading a current architected state of the existing hardware;
selecting one or more elements of the existing hardware into which the fault is to be injected;
modifying a state of the selected one or more elements of the existing hardware to have a different state representative of the injected fault;
writing the modified state back to the selected one more elements of the existing hardware; and
resuming the execution of the application workload on the existing hardware, 5. The method of claim 4, wherein the application fault injector operates based on fault injection parameters input to the application fault injector, wherein the fault injection parameters specify at least a timing of the fault injection performed by the application fault injector and whether the selection of the one or more elements is directed or random.

6. The method of claim 4, wherein the application derating front-end engine executes the application workload on the existing hardware a plurality of times in an iterative process and in each iteration causes the application fault injector to inject the fault into the existing hardware during the execution of the application workload, and wherein the application derating information is a statistical representation of the results of each iteration of the execution of the application workload on the existing hardware.

7. The method of claim 4, wherein the application fault injector is a process trace (ptrace) tool used for debugging of an application that is modified to inject the fault.

8. The method of claim 1, wherein combining the machine derating information with the application derating information to generate at least one SER value for the integrated circuit device design comprises calculating the at least one SER value based on a raw SER value for the integrated circuit device design and a product of the machine derating information and the application derating information.

9. The method of claim 1, further comprising;
determining, by the data processing system, at least one mean time to failure (MTTF) value based on the at least one soft error rate (SER) value for the integrated circuit device design;
comparing the determined MITF value to a target MTTF value to determine if the determined MTIT value is smaller than the target MTTF value; and
in response to the determined MTTF value being smaller than the target MTTF value, generating an indication of a need to modify the integrated circuit device design to increase the determined MTIT value.

10. The method of claim 1, wherein the execution of the machine derating front-end engine and the execution of the application derating front-end engine are performed in parallel.

11. A computer program product comprising a non-transitory computer readable medium having a computer readable program stored therein, wherein the computer readable program, when executed on a computing device, causes the computing device to:

implement a unified derating tool, wherein the unified derating tool comprises a machine derating front-end engine used to generate machine derating information for an integrated circuit device design, and an application derating front-end engine used to generate application derating information for the integrated circuit device design;

execute, by the unified derating tool, the machine derating front-end engine on a simulation of the integrated circuit device design to generate the machine derating information;

execute, by the unified derating tool, the application derating front-end engine to execute an application workload on existing hardware and inject a fault into the existing hardware during the execution of the application workload cm the existing hardware to generate the application derating information, wherein the application workload is not simulated but actually executed on the existing hardware, wherein the integrated circuit device design comprises new processor chin design, and wherein the existing hardware comprises an existing fabricated processor chip in a same family of processor chips as the new processor chip design; and combine the machine derating information with the application derating information to generate at least one soft error rate (SER) value for the integrated circuit device design.

12. The computer program product of claim 11, wherein the machine derating information comprises one or more machine derating factors identifying a relative measure of faults masked, recovered, or otherwise not detectable in an output of the integrated circuit device design, and w application derating information comprises one or more application derating factors identifying a relative measure, at a level of an application-visible state, of faults masked, recovered, or otherwise not detectable in an output of the application.

13. The computer program product of claim 11, wherein the computer readable instructions computing device to execute the machine derating front-end engine on the simulation of the integrated circuit device design by using an integrated circuit device design parameter file, the application workload, a profiler engine, and a residency analyzer to obtain the machine derating information for the integrated circuit device design, wherein the profiler engine obtains information about the execution of the application workload on the simulation of the integrated circuit device design as defined by the integrated circuit design parameter file, and wherein the residency analyzer generates residency statistics for elements of the integrated circuit device design, wherein the residency statistics identify how much execution time of the execution of the application workload is attributable to each of the elements.

14. The computer program product of claim 11, wherein the computer readable instructions cause the computing device to execute the application derating front-end engine by us an application fault injector to, inject the fault into the existing hardware during the execution of the application workload by:

stopping the execution of the application workload on the existing hardware;

reading a current architected state of the existing hardware;

selecting one or more elements of the existing hardware into which the fault is to be injected;

modifying a state of the selected one or more elements of the existing hardware to have a different state representative of the injected fault;

writing the modified state back to the selected one or more elements of the existing hardware; and resuming the execution application workload on the existing hardware.

15. The computer program product of claim 14, wherein the application fault injector operates based on fault injection parameters input to the application fault injector, wherein the fault injection parameters specify at least a timing of the fault injection performed by the application fault injector and whether the selection of the one or more elements is directed or random.

16. The computer program product of claim 14, wherein the application derating front-end engine executes the application workload on the existing hardware a plurality of times in an iterative process and in each iteration causes the application fault injector to inject the fault into the existing hardware during the execution of the application workload, and wherein the application derating information is a statistical representation of the results of each iteration of the execution of the application workload on the existing hardware.

17. The computer program product of claim 14, wherein the application fault injector is a process trace (ptrace) tool used for debugging of an application that is modified to inject the fault.

18. The computer program product of claim 11, wherein combining the machine derating, information with the application derating information to generate at least one SER value for the integrated circuit device design comprises calculating the at least one SER value based on a raw SER value for the integrated circuit device design and a product of the machine derating information and the application derating information.

19. The computer program product of claim 11, wherein the computer readable instructions further causes the computing device to:

determine at least one mean time to failure (MTTF) value based on the at least one soft error rate (SER) value for the integrated circuit device design;

compare the determined MTTF value to a target MTTF value to determine if the determined MTTF value is smaller than the target MTTF value; and in response to the determined MTTF value being smaller than the target MTTF value, generate an indication of a need to modify the integrated circuit device design to increase the determined MTTF value.

20. The computer program product of claim 11, wherein the execution of the machine derating front-end engine and the execution of the application derating front-end engine are performed in parallel.

21. An apparatus, comprising:

a processor; and a memory coupled to the processor, wherein the memory comprises instructions which, when executed by the processor, cause the processor to implement a unified derating tool, wherein the unified derating tool comprises a machine derating front-end engine used to generate machine derating information for an integrated circuit device design, and an application derating front-end engine used to generate application derating information for the integrated circuit device design;

execute, by the unified derating tool, the machine derating front-end engine on a simulation of the integrated circuit device design to generate the machine derating information;

execute, by the unified derating tool, the application derating front-end engine to execute an application workload on existing hardware and inject a fault into the existing hardware during the execution of the application workload on the existing hardware to generate the application derating information, wherein the application workload is not simulated but actually executed on the existing hardware, wherein the integrated circuit device design comprises a new processor chip design, and wherein the exiting hardware comprises an existing fabricated processor chip in the same family of processor chips as the new processor chip design; and combine the machine derating information with the application derating information to generate at least one soft error rate (SER) value for the integrated circuit device design.

22. The apparatus of claim 21, wherein the instructions cause the processor to execute the application derating front-end engine by using an application fault injector to inject the fault into the existing hardware during the execution of the application workload by:

stopping the execution of the application workload on the existing hardware;

reading a current architected state of the existing hardware;

selecting one or more elements of the existing hardware into which the fault is to be injected;

modifying a state of the selected one or more elements of the existing hardware to have a different state representative of the injected fault;

writing the modified state back to the selected one or more elements of the existing hardware; and resuming the execution of the application workload on the existing hardware.

23. The apparatus of claim 22, wherein the application fault injector operates based on fault injection parameters input to the application fault injector, wherein the fault injection parameters specify at least a timing of the fault injection performed by the application fault injector and whether the selection of the one or more elements is directed or random, 24. The apparatus of claim 22, wherein the application derating front-end engine executes the application workload on the existing hardware a plurality of times in an iterative process and in each iteration causes the application fault injector to inject the fault into the existing hardware during the execution of the application workload, and wherein the application derating information is a statistical representation of the results of each iteration of the execution of the application workload on the existing hardware.

25. The apparatus of claim 22, wherein the application fault injector is a process trace (ptrace) tool used for debugging of an application that is modified to inject the fault.

\* \* \* \* \*